(12) United States Patent
Gurney

(10) Patent No.: US 7,548,062 B1
(45) Date of Patent: Jun. 16, 2009

(54) 3D CONES GRADIENT WAVEFORM GENERATION

(75) Inventor: Paul Gurney, Irvine, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 12/055,584

(22) Filed: Mar. 26, 2008

(51) Int. Cl.
*G01V 3/00* (2006.01)
(52) U.S. Cl. .......................... 324/309; 324/307
(58) Field of Classification Search ......... 324/300–322; 600/407–445; 333/227–235, 219.1; 382/131
See application file for complete search history.

(56) References Cited

U.S. PATENT DOCUMENTS

| | | | |
|---|---|---|---|
| 5,532,595 A * | 7/1996 | Lampman et al. | 324/309 |
| 6,404,194 B1 * | 6/2002 | Irarrazabal et al. | 324/307 |
| 6,937,015 B2 * | 8/2005 | Heid | 324/307 |
| 7,372,937 B2 * | 5/2008 | Wang et al. | 378/16 |
| 7,439,739 B2 * | 10/2008 | Beatty | 324/309 |
| 7,444,011 B2 * | 10/2008 | Pan et al. | 382/131 |
| 2007/0010731 A1 * | 1/2007 | Mistretta | 600/407 |
| 2007/0161884 A1 * | 7/2007 | Black et al. | 600/407 |
| 2008/0037700 A1 * | 2/2008 | Grass et al. | 378/8 |

OTHER PUBLICATIONS

Gurney PT, et al., "Design and Analysis of a Practical 3D Cones Trajectory", Magn Reson Med, 55:575-582, 2006.
Gurney, Paul Thomas, "Magnetic Resonance Imaging Using a 3D Cones K-Space Trajectory", A Dissertation Submitted to the Department of Electrical Engineering and the Committee on Graduate Studies of Stanford University, 163 pages, Jun. 2007.

* cited by examiner

*Primary Examiner*—Brij B Shrivastav
(74) *Attorney, Agent, or Firm*—Beyer Law Group LLP

(57) ABSTRACT

A method of performing magnetic resonance imaging is provided. Sampling requirements are used to define a three dimensional cone trajectory differential equation. The equation is solved to obtain a starting point. A search is performed by performing a plurality of cycles, where each cycle comprises selecting a point on the cone trajectory, working backward from the starting point to reduce twist, providing a failure value if it is determined that when the twist reaches zero it is not possible to return to the origin at a final velocity of zero, and providing a success value if it is determined that when the twist reaches zero it is possible to return to the origin at a final velocity of zero. A plurality of cycles is performed, where each cycle comprises applying a magnetic resonance image excitation and scanning along the calculated cone trajectory and acquiring a readout.

18 Claims, 13 Drawing Sheets

US 7,548,062 B1

3D CONES GRADIENT WAVEFORM GENERATION

GOVERNMENT RIGHTS

The U.S. government has rights in the disclosed invention pursuant to NIH grants to Stanford University including R01 HL 39297.

BACKGROUND OF THE INVENTION

This invention relates generally to magnetic resonance imaging (MRI). Magnetic resonance imaging (MRI) is a non-destructive method for the analysis of materials and represents a new approach to medical imaging. It is generally non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body.

Magnetic resonance (MR) imaging is based on nuclear spins, which can be viewed as vectors in a three-dimensional space. During an MRI experiment, each nuclear spin responds to four different effects: precession about the main magnetic field, nutation about an axis perpendicular to the main field, and both transverse and longitudinal relaxation. In steady-state MRI experiments, a combination of these effects occurs periodically.

SUMMARY OF THE INVENTION

In accordance with the invention, a method of performing a three dimensional magnetic resonance imaging (MRI) is provided. Sampling requirements are used to define a three dimensional cone trajectory differential equation. The three dimensional cone differential equation is solved to obtain a three dimensional cone trajectory starting from a curvature starting point spaced apart from an origin. A search is performed for a border success by performing a plurality of cycles, where each cycle comprises selecting a point on the three dimensional cone trajectory after the curvature starting point, working backward from the curvature starting point to reduce twist, providing a failure value if it is determined that when the twist reaches zero it is not possible to return to the origin at a final velocity of zero while meeting system constraints, and providing a success value if it is determined that when the twist reaches zero it is possible to return to the origin at a final velocity of zero while meeting system constraints. A plurality of cycles is performed, where each cycle comprises applying a magnetic resonance image excitation and scanning along the calculated three dimensional cone trajectory and acquiring a readout. A three dimensional image is produced from the readout of the plurality of cycles.

In another manifestation, a method of calculating the three dimensional cone trajectory is provided. A search for the three dimensional cone trajectory with a specified time duration is performed by performing a plurality of cycles, comprising performing a search for a border success by performing a plurality of cycles, comprising selecting a point on the three dimensional cone trajectory after the curvature starting point, working backward from the curvature starting point to reduce twist, providing a failure value if it is determined that when the twist reaches zero it is not possible to return to the origin at a final velocity of zero while meeting system constraints, providing a success value if it is determined that when the twist reaches zero it is possible to return to the origin at a final velocity of zero while meeting system constraints. When the generated three dimensional cone trajectory has reached the specified time duration the calculating is stopped.

In another manifestation of the invention a magnetic resonance imaging apparatus is provided. A magnetic resonance imaging excitation and detection system is provided. A controller is electrically connected to the magnetic resonance imaging excitation and detection system and comprises a display, at least one processor, and computer readable media. The computer readable media comprises a) computer readable coded for using sampling requirements to define a three dimensional cone trajectory differential equation, b) computer readable code for solving the three dimensional cone differential equation to obtain a three dimensional cone trajectory starting from a curvature starting point spaced apart from an origin, c) computer readable code for performing a search for a border success by performing a plurality of cycles, comprising computer readable code for selecting a point on the three dimensional cone trajectory after the curvature starting point, computer readable code for working backward from the curvature starting point to reduce twist, computer readable code for providing a failure value if it is determined that when the twist reaches zero it is not possible to return to the origin at a final velocity of zero while meeting system constraints, and computer readable code for providing a success value if it is determined that when the twist reaches zero it is possible to return to the origin at a final velocity of zero while meeting system constraints, d) computer readable code performing for a plurality of cycles, wherein each cycle comprises applying a magnetic resonance imaging excitation, and scanning along the calculated three dimensional cone trajectory and acquiring a readout, e) computer readable code for producing a three dimensional image from the readout of the plurality of cycles, and f) computer readable code for displaying the three dimensional image on the display.

The invention and objects and features thereof will be more readily apparent from the following detailed description and appended claims when taken with the drawings.

DETAILED DESCRIPTION OF ILLUSTRATED EMBODIMENTS

Figure 1:
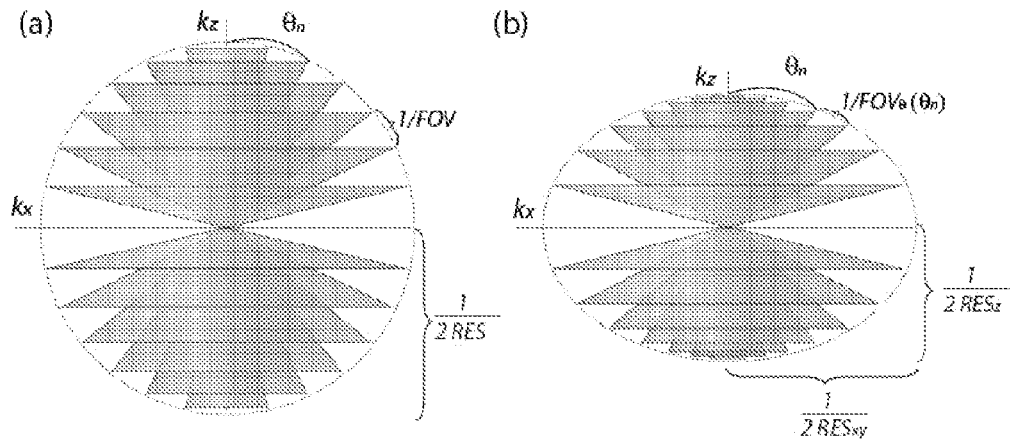
FIGS. 1a-b show examples of cones surfaces designed for both isotropic and anisotropic fields of view and resolutions.

When magnetic resonance imaging is performed in three dimensions, a large number of k-space trajectories become possible. Standard trajectories such as 2 DPR (two dimensional projection reconstruction) and 2 DFT (two dimensional Fourier Transform) can easily be extended to three dimensions, and trajectories such as spirals can be stacked up in the third dimension. Many new, wholly 3 D trajectories can also be introduced. For example, k-space can be covered using spherical shells or cones.

An embodiment of the invention focuses on the design of gradient waveforms that cover 3 D k-space using cones.

The 3 D cones k-space trajectory covers a set of cones that all share a common apex at the center of k-space, with spiral-like waveforms. Covering cones in 3 D k-space has many benefits since it combines the imaging advantages of radial trajectories with the flexible and favorable tradeoffs enabled with spiral trajectories.

1.1.1 Benefits of 3 D Cones

There are many properties of the 3 D cones k-space trajectory that are highly desirable for MRI. Some of these, such as short echo times, high readout duty cycles and robust motion properties are shared with radial trajectories like 3 DPR. However, in addition to these properties, the 3 D cones trajectory also enables highly favorable tradeoffs with respect to scan time and signal-to-noise ratio (SNR) efficiency.

1.1.2 Short Echo Times

The property which defines a radial trajectory is that it starts sampling at the center of k-space, which is usually where most of the image energy is located. Therefore, it is possible to design pulse sequences with ultra-short echo times. As a result, most of the important information about the image can be acquired very soon after the RF excitation. This is important when imaging species with short relaxation times, such as tendons or ligaments.

1.1.3 High Readout Duty Cycles

Since radial trajectories do not require phase-encoding gradients, they achieve high readout duty cycles (meaning that the total acquisition time is a greater percentage of the repetition time), which in turn can increase SNR. These high readout duty cycles are particularly important in steady-state imaging sequences with short repetition times.

1.1.4 Robust Motion Properties

Radial trajectories are often credited with having robust motion properties. Since the center of k-space is intrinsically oversampled, motion tends to result in blurring at low frequencies. For high frequencies, the resulting artifact is more diffuse than with rectilinear trajectories in which motion artifacts arise as coherent ghosts in the phase-encode direction.

A further frustration with rectilinear trajectories in the presence of motion is that image quality can vary greatly between scans. If there is significant motion during the short period of time that the center of k-space is being sampled, catastrophic artifacts may result. However, if the motion occurs while the outer regions of k-space are being sampled, then the artifacts may be mild. With 3 D radial trajectories, the origin of k-space is sampled during every readout, so motion artifacts will tend to always look the same. Therefore, the performance of motion correction schemes do not depend on when failures occur, making these schemes easier to evaluate, debug and improve.

1.1.5 Favorable Tradeoffs

As readout length increases, spiral-like trajectories can cover more and more k-space per readout and dramatically reduce the number of required readouts. This can result in significantly lower scan times. Furthermore, spirals can be designed to keep sampling densities more uniform, thereby increasing SNR efficiency. This ability to address two of the major drawbacks (large number of required readouts and poor SNR efficiency) of radial trajectories while still maintaining the benefits makes the 3 D cones k-space trajectory is a very compelling imaging technique.

1.1.6 Existing Cone Implementations

Despite the benefits of using 3 D cones k-space trajectories, there have been few published attempts at creating trajectory design algorithms.

One implementation of the 3 D cones trajectory projects a parametrically defined variable density spiral in the xy-plane onto each cone. The variable density is chosen to compensate for the oversampling at the center of k-space. One drawback of this technique is that it twists unnecessarily at the beginning of the trajectory, resulting in lower SNR efficiencies and longer readout times, especially for short readouts. Moreover, despite the attempt to compensate for sampling density, the distribution of sampled points can be highly anisotropic, leading to unwanted gaps between samples which result in aliasing artifacts in the final image.

Another implementation of a 3 D cones trajectory is called twisted projection imaging. This technique removes the unnecessary twist at the beginning (by starting with a radial line) and performs density compensation by solving a differential equation defining a trajectory with constant gradient amplitude with uniform density. This results in near-optimal SNR efficiency, which is especially important in its target application of imaging sodium, since this atom produces very little signal due to its small concentration and low gyromagnetic ratio. A version of twisted projection imaging that modifies the sampling density to match the expected fall-off of the sodium signal due to relaxation has also been implemented, which further increases SNR. However, because the gradient amplitude is kept artificially low over the entire readout (in order to simplify the differential equation to be solved and due to slew-rate limitations), the total number of readouts (and therefore scan time) is unnecessarily high for twisted projection techniques. This is not a severe problem in sodium imaging, where the low signal may necessitate several averages anyway, but it is inappropriate for fast imaging at high resolutions.

Both implementations rely on a hand-tuning of various non-intuitive input parameters in order to specify the trajectory, which makes it very challenging to create pulse sequences using this trajectory. Applications using these methods have shown the benefits of using the 3 D cones k-space trajectory, but there are still several improvements which can be made.

1.1.7 Design Goals

As discussed in the previous section, existing implementations have not yet harnessed the full potential of the 3 D cones trajectory. Five key areas are described below that will be addressed in creating a new trajectory design algorithm.

1.1.8 Improved Distribution of Sampled Points

All non-Cartesian trajectories are sensitive to the distribution of sampled points since their distribution is not constrained to lie on a grid. It is not enough to simply ensure that the average sampling density (number of points per k-space volume) is sufficient for a given field of view. Very close attention must be paid to the distribution. One way to do this is to enforce the constraint that no sphere with diameter 1/FOV can exist in the supported region of k-space without containing at least one point. This constraint ensures that any point will be, at the very most, a distance of 1/FOV away from another sampled point in any direction.

By definition, the k-space points will be constrained to lie on cones, and so the intrinsic oversampling of the cone surfaces must be considered when deciding how best to cover each cone. A function $\sigma(k_r)$ (where $k_r$ is the distance from the origin of k-space), which will scale the "1/FOV sphere" is defined appropriately to take this oversampling into account. That is, the "1/FOV sphere" constraint can be relaxed somewhat when the cones are highly oversampled. In the description of the preferred embodiment, special attention will be paid to what the $\sigma(k_r)$ function should be.

1.1.9 Reduced Imaging Times

Since MRI is a slow modality, it is desirable to reduce imaging times as much as possible. Each trajectory should cover k-space efficiently and not sample or twist unnecessarily. It should also try to use the gradient hardware to its fullest potential. In order to meet this goal, a differential equation describing the trajectory is found and then solved for the most rapidly increasing radial distance from the k-space origin. Special care is taken to minimize the overall gradient waveform duration even when designing transitions between radial lines and spiral-like waveforms.

1.1.10 Non-Isotropic Resolutions and Fields of View

Typical implementations of 3 D radial trajectories enforce isotropic resolution and spherical fields of view. However, many objects of interest are not necessarily spherical. Limiting the field of view in a particular direction can result in significant scan time savings, while reducing the resolution in a particular direction can both increase SNR and reduce scan time. It is therefore highly desirable to allow for non-isotropic resolutions and field of view.

The field of view, $FOV_\theta$, and resolution, $RES_\theta$, can be defined as functions which depend on the polar angle, $\theta$. While it is possible to define arbitrary field of view and resolution shapes, this embodiment of the invention will deal only with the case of ellipsoidal fields of view and resolutions defined by $FOV_{xy}$ and $RES_{xy}$, the field of view and resolution in the xy-plane, and $FOV_z$ and $RES_z$, the field of view and resolution in the z-axis.

In this case, analytical expressions for $FOV_\theta$ and $RES_\theta$ can be found as functions of $\theta$ by solving for the length of a line segment that intersects an ellipse at a given angle, $$FOV_\theta(\theta) = \frac{FOV_{xy}FOV_z}{\sqrt{(FOV_z^2 - FOV_{xy}^2)\sin^2(\theta) + FOV_{xy}^2}} \quad (3.1)$$

$$RES_\theta(\theta) + \frac{RES_{xy}RES_z}{\sqrt{(RES_z^2 - RES_{xy}^2)\sin^2(\theta) + RES_{xy}^2}} \quad (3.2)$$

1.3.4 Enhanced SNR Efficiency

SNR efficiency is a measure of the uniformity of the k-space weighting used in the reconstruction. The weighting is the inverse of the sampling density multiplied by whatever apodization function may be used. If the weighting at point i is denoted $w_i$ and a total of N points are acquired, then the SNR efficiency can be calculated as $$\eta = \frac{\sum w_i}{\sqrt{N \sum w_i^2}} \quad (3.3)$$

The SNR efficiency, $\eta$, has a proportional effect on the overall SNR, $$SNR \propto \eta(\text{Voxel Size})\sqrt{\text{AcquisitionTime}}, \quad (3.4)$$

and is therefore a very important metric. For example, a 20% decrease in SNR efficiency would require a 56% increase in acquisition time to achieve similar SNR. Furthermore, at lower and lower SNR efficiencies, the noise becomes "colored," meaning that it starts to contain distracting structure.

The sampling densities at each location in k-space can be adjusted by modifying the amplitude of the gradient waveforms appropriately, so that the ultimate k-space weighting is as uniform as possible. This modification will result in longer scan times since forcing a lower gradient amplitude will cause slower movement along the trajectory, but in many SNR-limited applications, this tradeoff is acceptable and desirable. The simplest way to accomplish this goal is to define a minimum density, $dens_{min}$, which must be maintained. As soon as the trajectory achieves this density, the gradient amplitude will be reduced to keep the density constant. Making the minimum density a function of the radial k-space position, $dens_{min}(k_r)$, would allow the matching of sampling density to an apodization function (which would maximize SNR efficiency in the presence of apodization).

1.3.5 Reusable Waveforms

In many applications requiring high resolutions and large fields of view, there may be hundreds of cone surfaces to cover. This can result in long computation times when generating the trajectories for each cone and also very large waveform memory requirements on the scanner. Furthermore, if measuring the trajectories using the methods is desired, it could be unreasonable to expect to be able to measure the waveforms associated with every cone surface.

For that reason, an embodiment of the invention designs waveforms that can be reused to cover cone surfaces at many different polar angles.

2 Trajectory Design Algorithm

The description of the algorithm used to design the waveforms implementing the 3 D cones trajectory is now considered, which takes into account the design goals described in the previous section. First, which cone surfaces to cover is chosen. For each cone surface, the trajectory along the cone is designed by selecting a required sampling distribution and observing hardware constraints. This step needs to be repeated several times to find the waveform with a desired readout length. Finally, some of the constraints can be modified to ensure that the generated waveforms are reusable for multiple cone surfaces.

2.1 Choosing Cone Surfaces

This embodiment starts by determining the number of required cone surfaces and their polar angles. If the cone surfaces are fully sampled, the cone surface at polar angle $\theta$ must be separated by a maximum distance of $1/FOV_\theta(\theta+\pi/2)$ from its adjacent cone surfaces. A simple algorithm is used starting at an initial polar angle of 0 and applying the constraint to adjacent cones until a polar angle greater than $\pi/2$ is reached. The obtained polar angles are then scaled so that the maximum polar angle is $\pi/2$ (ensuring a smooth progression). The set of resulting polar angles is then reflected about the xy-plane to cover all of k-space. FIGS. 1a-b show examples of cones surfaces designed for both isotropic (FIG. 1a) and anisotropic (FIG. 1b) fields of view and resolutions. Anisotropic resolutions are obtained by sampling an ellipsoid in k-space, while anisotropic fields of view are obtained by ensuring the cone surfaces are separated by different distances in k-space at different polar angles.

In the simple case of isotropic field of view, FOV and resolution, RES, the number of required cones is $$N_{cones} = \left\lceil \frac{\pi}{2} \frac{FOV}{RES} \right\rceil + 1 \tag{3.5}$$

and the required polar angles are $$\theta_n = \pi\left(\frac{n}{N_{cones}-1}\right), n = 0 \ldots N_{cones} - 1. \tag{3.6}$$

2.2 Designing a Trajectory Along a Cone

Given a particular cone surface, how to cover the surface with an appropriate k-space trajectory will now be described. The input parameters which are used to prescribe the trajectory are first defined, and then how these parameters can be used to determine the required sampling distribution is discussed. How the required sampling distribution depends on the spacing between cones is compensated for will be seen for several possible compensation schemes. Hardware and sampling density constraints will be analyzed. How to actually generate the desired time-optimal trajectory will be described.

2.2.1 Input Parameters

To satisfy all the design goals described, the algorithm that designs the trajectory must take into account many input parameters, which are listed in Table 1, used by the 3 D cones trajectory design algorithm in an embodiment of the invention.

TABLE 1

Input parameters used by the 3D cones trajectory design algorithm

| Parameter | Description |
|---|---|
| $\theta_n$ | Polar Angle of the desired cone |
| $FOV_{rad}(\theta_n)$ | Radial FOV ($FOV_\theta(\theta_n)$) |
| $FOV_{azi}$ | Azimuthal FOV ($FOV_\theta(\pi/2)$) |
| $k_{max}(\theta_n)$ | Maximal radial extent in k-space ($1/RES_\theta(\theta_n)$) |
| $N_{int}(\theta_n)$ | Number of interleaves used to cover this cone |
| $T_s$ | Sampling period (time per sampled point) |
| $S_{max, xy}$ | Maximum gradient slew rate in the xy-plane |
| $S_{max, z}$ | Maximum gradient slew rate on the z-axis |
| $G_{max, xy}$ | Maximum gradient amplitude in the xy-plane |
| $G_{max, z}$ | Maximum gradient amplitude on the z-axis |
| $dens_{min}(k_r)$ | Minimum desired sampling density as a function of radial distance, $k_r$. |
| $\sigma(k_r)$ | Intercone spacing compensation factor, used to scale the "1/FOV" sphere |

2.2.2 Determining Sampling Requirements

In order to design waveforms which cover the cone as quickly as possible, the minimum required twist as a function of radial distance ($k_r$) from the origin of k-space must be determined. The minimum twist will be the one which satisfies the constraint that the scaled "1/FOV" sphere (which for non-isotropic fields of view is actually an ellipsoid) is always just touching a sampled point.

Figure 2:
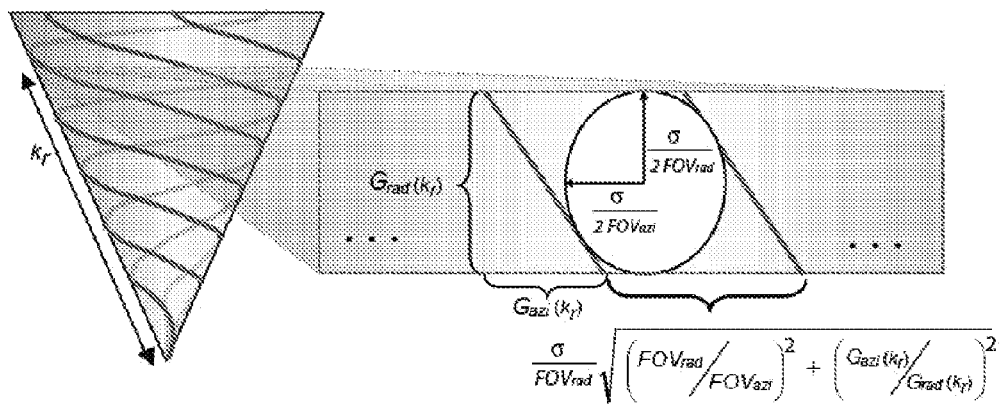
FIG. 2 shows a cone with a portion of the circumferential strip at a particular radial distance $k_r$ expanded, along the cone.

FIG. 2 shows a cone with a portion of the circumferential strip at a particular radial distance $k_r$ expanded, along the cone. The trajectory covering the cone can be decomposed into the part that is pointing in the radial direction, $G_{rad}(k_r)$, and the part that is pointing in the azimuthal direction, $G_{azi}(k_r)$. The ratio $G_{twist}(k_r) = G_{azi}(k_r)/G_{rad}(k_r)$ describes how much the trajectory twists relative to a radial spoke. The maximum length of the strip covered by one interleaf of the trajectory (taking into account the "1/FOV" sphere constraint) is $$\frac{\sigma(k_r)}{FOV_{rad}(\theta_n)} \sqrt{G_{twist}(k_r)^2 + \left(\frac{FOV_{rad}(\theta_n)}{FOV_{azi}}\right)^2} \tag{3.7}$$

The circumference of the strip is $2\pi \sin(\theta_n) k_r$ and so the number of interleaves required for a particular cone is $$N_{int}(\theta_n) = \frac{2\pi \sin(\theta_n) k_r FOV_{rad}(\theta_n)}{\sigma(k_r) \sqrt{G_{twist}(k_r)^2 + \left(\frac{FOV_{rad}(\theta_n)}{FOV_{azi}}\right)^2}} \tag{3.8}$$

Solving for $G_{twist}(k_r)$, one obtains the requirement that $$G_{twist}(k_r) \geq \sqrt{\max\left(0, \frac{c_1(\theta_n) k_r^2}{\sigma(k_r)^2} - c_2(\theta_n)\right)} \tag{3.9}$$

It is instructive at this point to compare this expression to those of more typically used spirals. Archimedean spiral and variable density spiral algorithms generally make the assumption that $$\frac{c_1(\theta_n)k_r^2}{\sigma(k_r)^2} \ll c_2(\theta_n) \quad (3.10)$$

and therefore that $$G_{twist}(k_r) \geq \frac{k_r}{\sigma(k_r)}\sqrt{c_1(\theta_n)} \quad (3.11)$$

which is much simpler but results in unnecessary twist.

Figure 3:
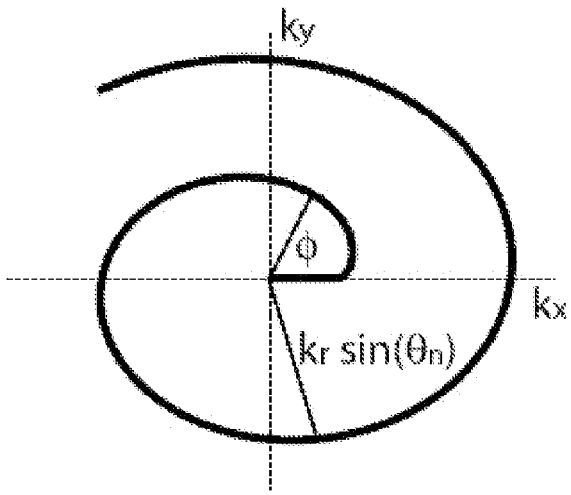
FIG. 3 illustrates a projection of the k-space trajectory onto the xy-plane, showing the definition of the azimuthal angle $\phi$ and the radial distance in the xy-plane $k_r \sin(\theta_n)$.

Given the minimum twist, an expression for the k-space trajectory is determined. FIG. 3 illustrates a projection of the k-space trajectory onto the xy-plane, showing the definition of the azimuthal angle $\phi$ and the radial distance in the xy-plane $k_r \sin(\theta_n)$. Assuming some radial distance $k_r(t)$ as a function of time and an azimuthal angle $\phi(k_r(t))$ (both defined and shown in FIG. 3), an equation for the desired k space trajectory can be written as, $$k_{xy}(t) = k_r(t)e^{i\phi(k_r(t))\sin[\theta_n]} \quad (3.12)$$

$$k_z(t) = k_r(t)\cos(\theta_n) \quad (3.13)$$

where $k_{xy}(t)$ is a complex number whose real part is the x-component of the trajectory and whose imaginary part is the y-component of the trajectory. $k_r(t)$ is presumed to increase monotonically from 0 up to $k_{max}$.

By recognizing that in the limit, azimuthal distances can be converted to azimuthal angles by dividing by $k_r(t)\sin(\theta_n)$, the desired change in azimuthal angle per unit change in radial distance as a function of $G_{twist}$ can be defined as, $$\frac{d\phi(k_r(t))}{dk_r} = \frac{G_{twist}(k_r(t))}{k_r(t)\sin\theta_n} \quad (3.14)$$

Then, integrating gives $$\phi(k_r(t)) = \int_0^t \frac{d\phi(k_r(\tau))}{dk_r(\tau)}\frac{dk_r[\tau]}{d\tau} d\tau \quad (3.15)$$

which provides an expression for the k-space trajectory in terms of $G_{twist}$.

2.2.3 Compensation for Intercone Spacing

The final step in determining the sampling requirements is to find an appropriate function $\sigma(k_r(t))$. $\sigma(k_r(t))$ could be set to be equal to 1, which corresponds to fully sampling each cone. But since the cones collectively lead to oversampling near the k-space origin, it is not necessary to completely cover the area of each cone, particularly for small values of $k_r$.

The intrinsic oversampling of the cone surfaces is proportional to $1/k_r$. Full density compensation would involve setting $\sigma(k_r(t)) = k_{max}(\theta_n)/k_r(t)$. This would ensure that the overall sampling density of the cones would be approximately constant, which would enhance SNR efficiency. However, since it was assumed that the cones were fully sampled when choosing the cone surfaces in Section 2.1, this compensation scheme is inappropriate. Instead, to meet the design goal discussed in Section 1.3.1, the twist must be carefully adjusted ensuring that the "1/FOV" sphere constraint is always met.

Figure 4:
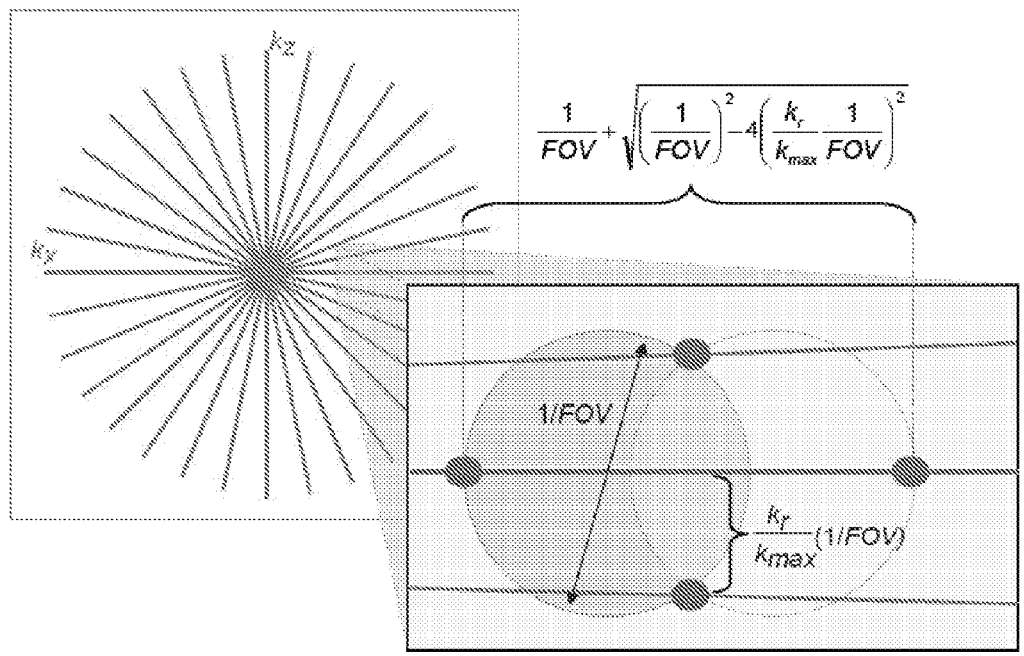
FIG. 4 shows a slice through the set of cones, with a portion expanded to show the intercone sampling effects.

If the trajectories on every other cone are rotated around the z-axis by half an interleaf, adjacent cones can reduce the coverage required for one another. FIG. 4 shows a slice through the set of cones, with a portion expanded to show the intercone sampling effects. When adjacent cones are close enough, their sampled points can increase the required intertrajectory spacing along each cone. As shown in FIG. 4, for $k_r/k_{max}(\theta_n) < 0.5$, the radial separation of points can be increased by an intercone spacing compensation factor, $$\sigma(k_r) = 1 + \sqrt{\max(0, 1-4(k_r/k_{max}(\theta_n))^2)} \quad (3.16)$$

resulting in what is defined here as "intercone compensation."

This compensation scheme is only valid if adjacent cones have equal numbers of interleaves which have been rotated by a half-interleaf, $\pi/N_{int}(\theta_n)$ radians. For adjacent cones with different numbers of interleaves, it is impossible to achieve a half-interleaf spacing for all azimuthal angles. In that situation, the location of the half-interleaf spacing should be spread out as much as possible by using either a random rotation or a rotation that is specified by a bit-reversed sequence. This reduces the coherence of the anisotropy and the resulting artifacts are usually negligible. Nonetheless, in applications which do not require the fastest possible scan times (such as severely SNR-limited cases), the pulse sequence programmer may prefer to simply fully sample every cone.

As will later be seen, in order for the trajectory design algorithm to be successful, it must be ensured that $d\sigma(k_r)/dk_r$ exists for $k_r > k_{start}$, where $k_{start}$ refers to the point where twisting begins. Unfortunately, the $\sigma(k_r)$ defined in Equation 3.16 is undifferentiable at $k_r = k_{max}/2$. This can be resolved by multiplying the square root term by a spline that goes to 0 faster than the square root term does. For example, $\sigma(k_r)$ is set $$\sigma(k_r) = 1 + \xi(k_r)\sqrt{\max(0, 1-4(k_r/k_{max}(\theta_n))^2)} \quad (3.17)$$

with $$\xi(k_r) = \begin{cases} 1 & k_r \in (0, k_{max}/2 - 2/\chi] \\ 1 - \frac{(k - k_{max}/2 + 2/\chi)^2}{2/\chi^2} & k_r \in (k_{max}/2 - 2/\chi, k_{max}/2 - 1/\chi] \\ \frac{(k - k_{max}/2)^2}{2/\chi^2} & k_r \in (k_{max}/2 - 1/\chi, k_{max}/2] \\ 0 & k_r \in (k_{max}/2, k_{max}] \end{cases} \quad (3.18)$$

where $1/\chi$ is a measure of the half-width of the spline. Differentiating Equation 3.17 and using L'Hopital's rule shows that with this formulation, $d\sigma(k_r)/dk_r$ exists and is well behaved. The variable $\chi$ can be used to enable partial intercone spacing compensation. When $\chi = 0$, there is no intercone spacing compensation and the cones are fully sampled. As $\chi$ becomes very large, more intercone spacing compensation is enforced but $d\sigma(k_r)/dk_r$ becomes less well behaved. Values of $\chi$ as large as $20/k_{max}$ work well and this value can effectively be considered full compensation.

Figure 5:
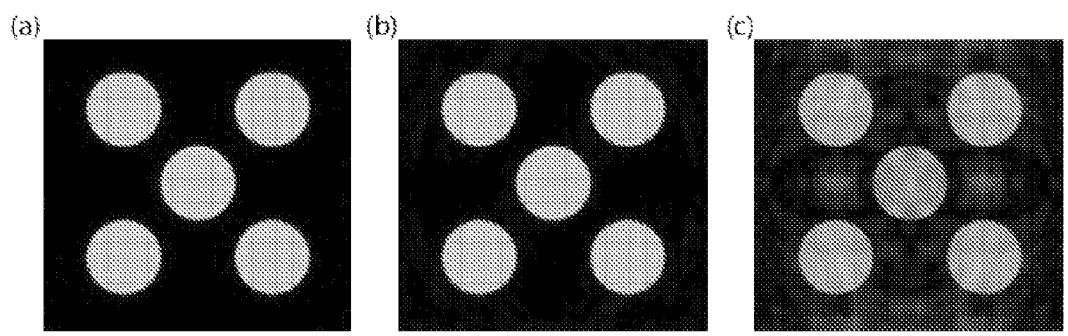
FIGS. 5a-c shows a numerical simulation comparing fully sampled cones, cones with intercone compensation, and cones with density compensation strategies.

FIGS. 5a-c shows a numerical simulation comparing fully sampled cones FIG. 5a, cones with intercone compensation FIG. 5b, and cones with density compensation strategies FIG. 5c for a resolution of 1 mm, an FOV of 10 cm, and numerical spheres with radii of 2 cm. Clearly, the density compensated strategy introduces a very distracting low-frequency artifact, while the intercone compensation is almost artifact-free.

Figure 6:
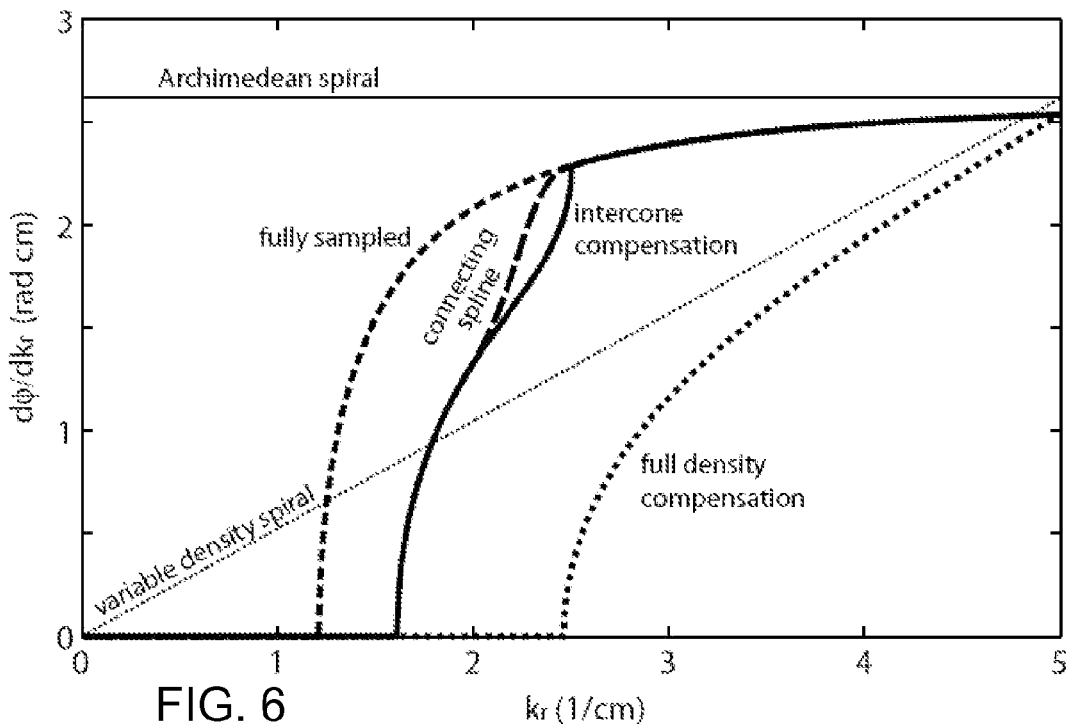
FIG. 6 shows representative examples of the required minimum $d\phi/dk_r$ functions for the many possible sampling strategies.

FIG. 6 shows representative examples of the required minimum $d\phi/dk_r$ functions for the many possible sampling strategies described above for a cone with a polar angle of 20 degrees, and prescribed resolution of 1 mm and FOV of 10 cm. The connecting spline corresponds to $\chi=4$. Using a projection of an Archimedean spiral onto the cone applies unnecessary twist. Projecting a variable density spiral onto the cone applies unnecessary twist at the k-space origin and not enough twist at the outside of k space (as compared to the intercone compensated case). The intercone compensation strategy requires an amount of twist somewhere in between the fully sampled approach and the density compensated approach, without introducing significant artifacts.

2.2.4 Additional Constraints

In addition to the sampling requirements determined above, several other constraints must be considered.

The amplifiers used to generate the currents played out on the gradient coils only maintain linearity over some range, and so the gradient waveform amplitudes must be limited to be less than some maximum, $G_{max,xy}$, in the xy-plane and $G_{max,z}$ in the z-axis. Note that the trajectory need only be freely-rotatable around the z-axis, and so the constraints in the xy-plane and the z-axis can be treated separately. This gives $$\left(\frac{\gamma}{2\pi}\right)^{-1}\left\|\frac{dk_{xy}(t)}{dt}\right\| = \|g_{xy}(t)\| \leq G_{max,xy} \quad (3.19)$$

$$\left(\frac{\gamma}{2\pi}\right)^{-1}\left\|\frac{dk_z(t)}{dt}\right\| = \|g_z(t)\| \leq G_{max,z} \quad (3.20)$$

where $g_{xy}(t)$ and $g_z(t)$ are the gradient waveforms in the xy-plane and z-axis, respectively.

In order to change the current flowing through the gradient coils, a certain amount of energy is required to overcome the inductance in the coils. Therefore, the gradient waveform slew rates must be limited to be less than some maximum $S_{max,xy}$ in the xy-plane and $S_{max,z}$ in the z-axis, $$\left(\frac{\gamma}{2\pi}\right)^{-1}\left\|\frac{d^2k_{xy}(t)}{dt^2}\right\| = \|s_{xy}(t)\| \leq S_{max,xy} \quad (3.21)$$

$$\left(\frac{\gamma}{2\pi}\right)^{-1}\left\|\frac{d^2k_z(t)}{dt^2}\right\| = \|s_z(t)\| \leq S_{max,z} \quad (3.22)$$

where $s_{xy}(t)$ and $s_z(t)$ are the slew rates in the xy-plane and z-axis, respectively.

Finally, as described earlier, it is desirable to enable the application of a minimum sampling density, $dens_{min}$, which can be done by limiting the rate of change of $k_r$. The application of this constraint is discussed in more detail in Appendix A.

3.2.2.5 Generating Waveform Segments

Now that the sampling distribution requirements and the applicable constraints have been determined, the corresponding time-optimal k-space trajectory must be generated.

Equations 3.12-3.15 provide an analytical expression for the desired k-space trajectory as a function of $k_r(t)$, which increases monotonically from 0 to $k_{max}$. To achieve the shortest possible waveforms, $dk_r(t)/dt$ is maximized at each point in time, subject to the appropriate constraints.

Appendix A describes in detail how to find the shortest possible waveform using a 4th-order Runge-Kutta differential equation solver for sets of equations, which is described in the appendix. However, this method requires the second derivative of $\phi(k_r)$ to be defined and continuous. Clearly, where the trajectory first starts to twist, this is not the case. Therefore, the initial conditions are set such that the differential equation is solved starting from the point that the twisting begins, $k_{start}$, with an initial condition setting the gradient currents set to 0. A simple trapezoidal waveform can then be designed to generate the transition from the origin to the point where the twisting begins.

Figure 7:
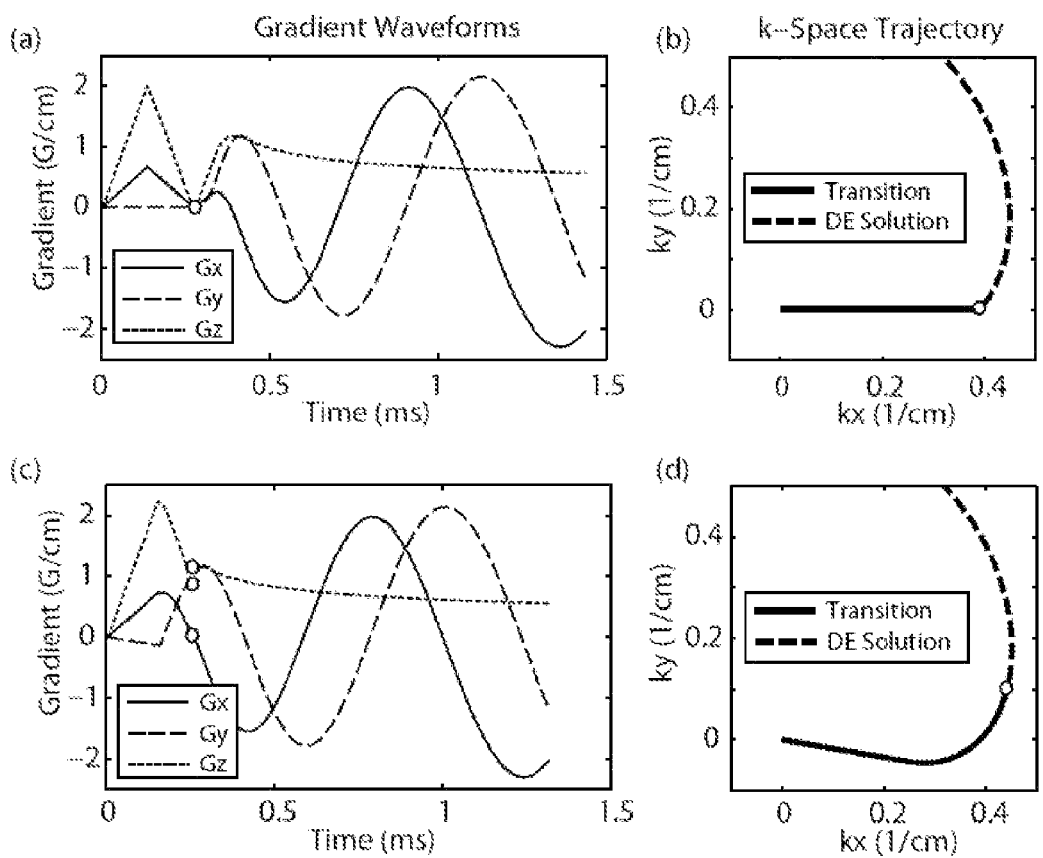
FIGS. 7a-d show sample gradient waveforms and k-space trajectories.

FIGS. 7$a$-$d$ show sample gradient waveforms and k-space trajectories for a polar angle of 20 degrees, resolution of 1 mm and FOV of 10 cm with intercone compensation where FIG. 7$a$ shows gradient waveforms and FIG. 7$b$ shows k-space trajectories for simple trapezoidal transition. FIGS. 7$a$-$b$ demonstrate the situation, where the gradient returns to 0 at the point the k-space trajectory starts to twist. The small circles mark the point between the transition waveform and the solution to the differential equation (DE). This results in the trajectory having exactly the minimum required twist at all points.

This trajectory is slightly inefficient and it would be preferable to allow some additional twist if that would allow larger gradient amplitudes and shorter overall waveforms (similar to the 2D WHIRL method). By designing a transition region that is allowed to have extra twist, the waveform can in fact be shortened, as demonstrated in FIGS. 7$c$-$d$. FIG. 7$c$ shows gradient waveforms and FIG. 7$d$ shows a k-space trajectory where the transition region is allowed to apply extra twist, and where the gradient does not need to return to 0.

To create twisting transition regions, it is easiest to work backwards, starting at a given point on the trajectory generated as a solution to the differential equation and trying to reach the origin of k-space as quickly as possible with a zero gradient at that point. At least one solution is guaranteed since the trivial case can be used where the transition waveform is just a trapezoid with a gradient amplitude of zero.

Starting from a given point on the trajectory generated by the solution of the differential equation (the "generated trajectory"), this embodiment proceeds in two stages. In the first stage, the reduction in the amount of twist is attempted as fast as possible while also maintaining a large gradient. Once the twist has been reduced to zero (i.e. the k-space trajectory is pointing to the origin), the second stage is to determine if it is possible to create a gradient waveform which has the correct starting and ending gradient values and correct area to return the trajectory to the origin.

Figure 8:
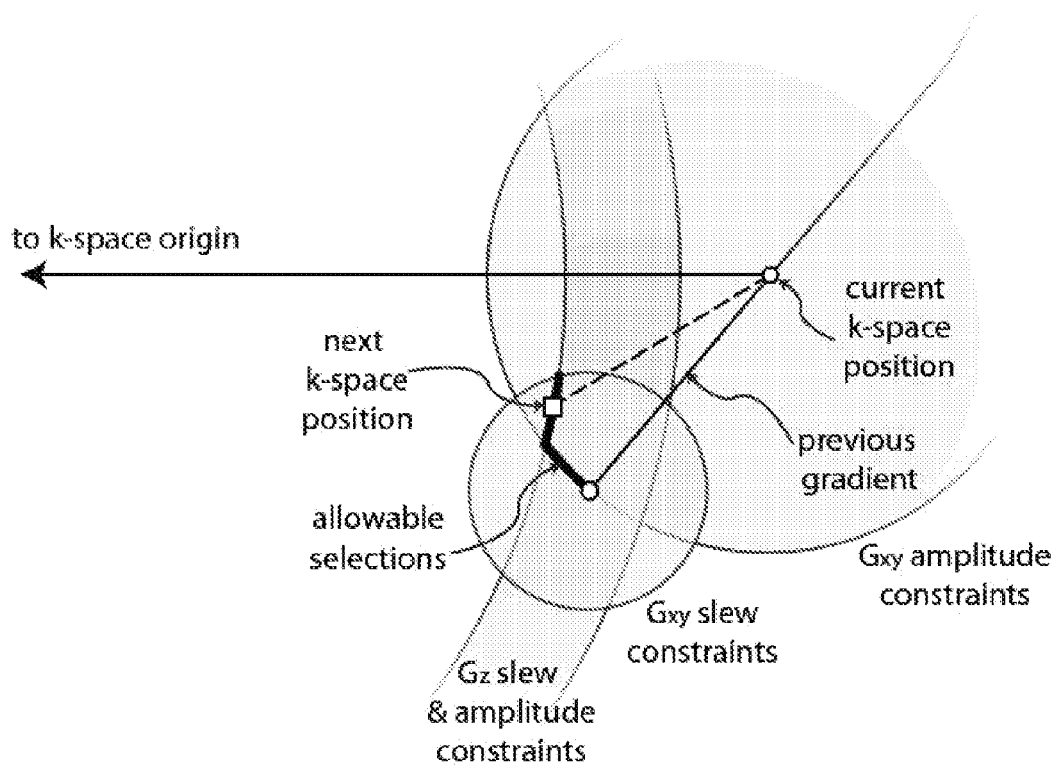
FIG. 8 depicts many constraints that must be satisfied.

The first step can be visualized graphically, and the many constraints that must be satisfied are depicted in FIG. 8. A range of points with minimum radial distance at each azimuthal angle $\phi$, which satisfy all these constraints are marked with a bold line in FIG. 8. Starting at a given point on the generated trajectory (the current k-space position), the vector that points to the origin and the gradient vector (the previous gradient) at that point are known. Gradient amplitude constraints in the xy-plane can be represented as a circle centered at the k-space vector, and the gradient slew-rate constraints in the xy plane can be represented as a circle centered at the vector difference of the k-space vector and the gradient vector (the k-space point, shown as a tiny white circle, which would result if the gradient did not change). The amplitude and slew-rate constraints in the z-axis can be used to determine the maximum allowable changes in the xy-component of $k_r$; these can be represented as circles centered at the k-space origin.

The minimum allowed $d\phi/dk_r$, specified by Equation 3.14 must be considered. It may be that the point with minimum $d\phi/dk_r$ (e.g., the intersection of the gradient slew rate constraint in the xy-plane and the z-axis) has a $d\phi/dk_r$ which is too small. Since $d\phi/dk_r$ is monotonically varying along the range of allowable selections, a binary search can be performed to find the point where $d\phi/dk_r$ is exactly equal to the minimum value, marked by the small square in FIG. 3.

This process is repeated sequentially until the selected point lies along the vector pointing to the k-space origin (a $d\phi/dk_r$ value of 0). If it is ever impossible to achieve the minimum required $d\phi/dk_r$, a different starting point must be chosen on the generated trajectory.

Once $d\phi/dk_r=0$ has been reached, the second step is to determine if it is possible to return to the origin with a gradient amplitude equal to zero.

Given a starting gradient amplitude, $G_c$, the minimum k-space traversal achievable with an immediate ramp from $G_c$ down to 0 with maximum slew rate is $$k_{ramp} = \left(\frac{\gamma}{2\pi}\right)\frac{G_c^2}{2S_{max}} \quad (3.23)$$

If $k_{ramp}$ is greater than the radial k-space value for which $d\phi/dk_r=0$ was reached, then the algorithm failed to find a valid waveform, and a different starting point must be chosen from the generated trajectory. Otherwise, a waveform meeting the requirements exists.

Given this two-stage process, a binary-search algorithm can quickly determine the starting point on the generated trajectory that results in the gradient waveforms with minimum length. However, special care must be taken if all possible starting points give valid and decreasing overall trajectory readout times. This typically occurs when $k_{start}$ is close to $k_{max}$. In this case, the trajectory generated by the differential equation may be disregarded, the starting radial k-space value is set to be $k_{max}$ and a binary search is performed to find the maximum valid starting gradient amplitude. In the end, a gradient waveform with minimum length is generated that satisfies both the sampling requirements and the hardware requirements.

3.2.3 Designing for Readout Length

The trajectory design algorithm described above takes many input parameters (including number of interleaves used to cover the cone, $N_{int}(\theta_n)$) and outputs the shortest possible waveform that satisfies all the constraints.

However, since waveforms for many different polar angles will be designed, and each waveform will be used in the same pulse sequence, it is preferable to have the readout length be an input parameter instead. In this case, it is desirable that the algorithm outputs the waveform of that readout length that requires the minimum number of interleaves. Since the number of interleaves vs. readout length tradeoff is monotonic, this can be accomplished using a fast binary search algorithm.

The algorithm starts by determining a range over which to do a binary search. This is accomplished by doubling the number of interleaves on every iteration until a value is found that results in a readout length shorter than the one desired. The range over which to search is then simply between the last two attempted numbers of interleaves.

By allowing fractional numbers of interleaves, $N_{int}(\theta_n)$, readout lengths can be achieved that are arbitrarily close to the desired length. Of course, before playing out the waveforms on the scanner, $N_{int}(\theta_n)$ will need to be rounded up to the nearest integer.

3.2.4 Designing Reusable Cones

As discussed in Section 1.3.5, it is desirable to design waveforms that can be used for a particular range of polar angles, $0<\theta_{lower}<|\theta_n|<\theta_{upper}<\pi/2$. That is, $\theta_{lower}$ and $\theta_{upper}$ describe the range of polar angles for which the resulting waveform may be used (with appropriate scaling) without violating gradient amplitude and slew rate constraints.

The embodiment starts by choosing a polar angle somewhere in the middle of the range (say, the center in a parametric sense), $$\theta_{mid} = a\tan\left(\frac{RES_{xy}}{RES_z}\frac{\sin(\theta_{upper})}{\cos(\theta_{lower})}\right) \quad (3.24)$$

If a trajectory is designed for this polar angle, then any cone surface can be obtained in the range by scaling its components as $$k_{xy}(\theta_n) = \frac{k_{max}(\theta_n)\sin(\theta_n)}{k_{max}(\theta_{mid})\sin(\theta_{mid})}k_{xy}(\theta_{mid}) \quad (3.25)$$

$$k_z(\theta_n) = \frac{k_{max}(\theta_n)\cos(\theta_n)}{k_{max}(\theta_{mid})\cos(\theta_{mid})}k_z(\theta_{mid})$$

Taking into account these scalings, the slew-rate and amplitude constraints can be divided by the largest corresponding scalings to ensure that they will not be violated even after scaling, $$S_{max,xy}(\theta_{mid}) = \frac{k_{max}(\theta_{mid})\sin(\theta_{mid})}{k_{max}(\theta_{upper})\sin(\theta_{upper})}S_{max} \quad (3.26)$$

$$S_{max,z}(\theta_{mid}) = \frac{k_{max}(\theta_{mid})\cos(\theta_{mid})}{k_{max}(\theta_{lower})\cos(\theta_{lower})}S_{max}$$

$$G_{max,xy}(\theta_{mid}) = \frac{k_{max}(\theta_{mid})\sin(\theta_{mid})}{k_{max}(\theta_{upper})\sin(\theta_{upper})}G_{max}$$

$$G_{max,z}(\theta_{mid}) = \frac{k_{max}(\theta_{mid})\cos(\theta_{mid})}{k_{max}(\theta_{lower})\cos(\theta_{lower})}G_i$$

Aside from the change in gradient slew and amplitude constraints, everything in the design algorithm proceeds as usual, although new required numbers of interleaves must be determined for each of the scaled versions of the waveforms. This is accomplished by numerically differentiating to find $$\frac{d\theta(k_r(t))}{dk_r},$$

and then solving for $$N_{int}(\theta_n, k_r) = \frac{2\pi\sin(\theta_n)k_r FOV_{rad}(\theta_n)}{\sqrt{\left(\frac{d\phi(k_r(t))}{dk_r}k_r(t)\sin(\theta_n)\right)^2 + \left(\frac{FOV_{rad}(\theta_n)}{FOV_{azi}}\right)^2}} \quad (3.27)$$

at every point in the scaled trajectory. Rounding the maximum value up to the nearest integer gives the number of required interleaves $N_{int}(\theta_n)$ for that scaled trajectory.

Figure 9:
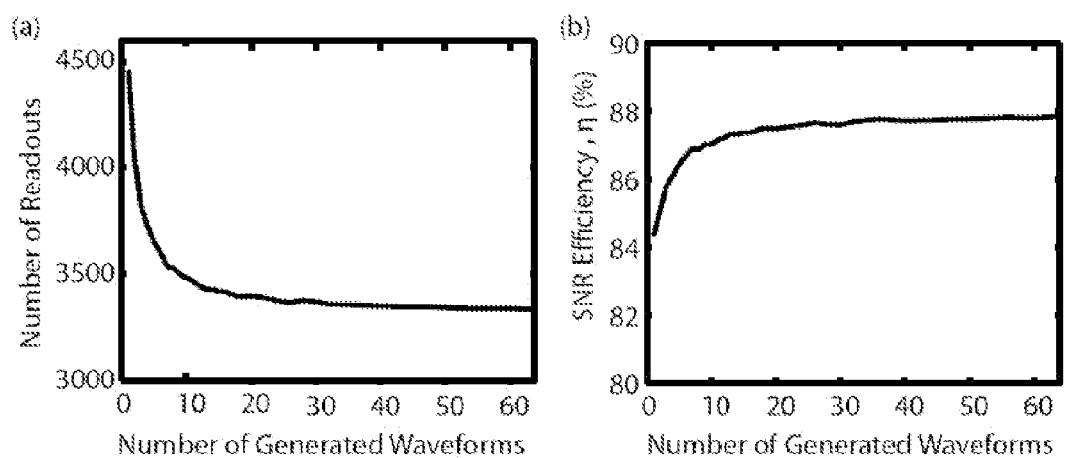
FIGS. 9a-b shows that the overall set of waveforms will not be as efficient as when each polar angle had its own waveform.

Using this scheme, it is possible to design only some arbitrary number of waveforms (including, for example, just a single waveform) that are then scaled and rotated to implement the 3 D cones trajectory. Clearly, the overall set of waveforms will not be as efficient as when each polar angle had its own waveform, as shown in FIGS. 9a-b. The effect of the number of generated waveforms on the number of readouts is shown in FIG. 9b and the SNR efficiency is shown in FIG. 9b, for a prescribed resolution of 1 mm, FOV of 10 cm, intercone compensation, and a 2 ms readout time. In general, using a smaller number of ranges increases the total number of readouts required since the maximum slew rate of the gradients cannot be fully used for each cone. Using fewer waveforms will also slightly reduce SNR efficiency. Nonetheless, using a fixed number of ranges significantly simplifies pulse sequence programming and this is a tradeoff many pulse sequence designers may wish to choose. Generating between 24 and 32 sets of waveforms is typically sufficient to obtain most of the benefit from using multiple waveforms.

3.2.5 Calculating the Sampling Density

Now that the entire trajectory has been designed, the sampling density (which is required for the gridding reconstruction) can be calculated at every point on every cone. For each unit in the radial direction, $$\frac{dk_r(t)}{dt} T_s,$$

the corresponding area the trajectory must cover is equal to the distance between adjacent cones, $$\frac{k_r(\theta_n)}{k_{mas}(\theta_n)} \frac{1}{FOV_\theta(\theta_n + \pi/2)},$$

multiplied by the length of the circumferential strip, $2\pi \sin(\theta_n)k_r(\theta_n)$. Dividing the number of interleaves used to cover the cone by the effective volume per sampled point, the overall sampling density is given by $$dens(k_r(t), \theta_n) = \frac{\lceil N_{int}[\theta_n] \rceil}{\frac{dk_r(t)}{dt} T_s} \frac{FOV_\theta(\theta_n + \pi/2)k_{max}(\theta_n)}{2\pi \sin(\theta_n)k_r(t)^2} \quad (3.28)$$

3.3 Trajectory Analysis

Now that a means of generating practical 3 D cones k-space trajectories is provided, the many possible implementations can be analyzed. First, the available tradeoffs between required readouts, SNR efficiency and readout length will be looked at. The point spread functions obtained with various σ(k_r) functions are compared. Finally, two of the exciting features enabled by the trajectory design algorithm—the ability to increase SNR efficiency by enforcing minimum sampling densities and the ability to acquire anisotropic fields of view are explored.

3.3.1 Tradeoff Curves

Figure 10:
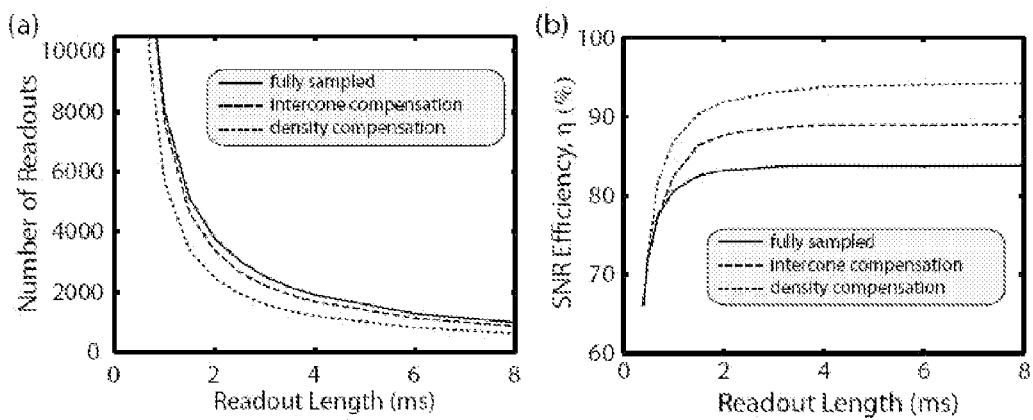
FIGS. 10a-b show the tradeoff curves relating number of required readouts and SNR efficiency versus readout length for the 3 D cones trajectory.

FIGS. 10a-b show the tradeoff curves relating number of required readouts, FIG. 10a, and SNR efficiency, FIG. 10b, versus readout length for the 3 D cones trajectory for a resolution of 1 mm, FOV of 10 cm, maximum gradient amplitude of 40 mT/m, and a maximum gradient slew rate of 150 T/m/s. For a given resolution, increasing the allowable readout length can result in dramatic reductions in the required number of readouts and increases in the SNR efficiency.

Table 2 shows the number of readouts required for various readout length for a resolution of 1 mm, FOV of 10 cm, maximum gradient amplitude of 40 mT/m, and a maximum gradient slew rate of 150 T/m/s. Table 3 shows the SNR efficiency obtained for various readout lengths for a resolution of 1 mm, FOV of 10 cm, maximum gradient amplitude of 40 mT/m, and a maximum gradient slew rate of 150 T/m/s. Tables 2 and 3 show that in the intercone compensated case, a 4 times increase in readout length (from 0.5 ms to 2.0 ms) gives a 6.4 times reduction in the number of readouts and a 21% increase in SNR efficiency. This is a highly favorable tradeoff and one that is unavailable in other 3 D trajectories such as 3 DFT or 3 DPR. For comparison, with the same parameters as those in the tables, 3 DFT would require 10,000 readouts while 3 DPR would require 31,416 readouts. The tables also demonstrate that the intercone compensation scheme results in fewer required readouts and higher SNR efficiencies than the fully sampled and Archimedean cases, although the relative benefits change as the readout length gets longer.

TABLE 2

|  | 0.5 ms | 1.0 ms | 2.0 ms |
| --- | --- | --- | --- |
| Archimedean | 34,288 | 9248 | 3999 |
| Fully sampled | 21,467 | 7991 | 3782 |
| Intercone compensation | 21,467 | 7612 | 3367 |
| Density compensation | 20,337 | 5640 | 2461 |

TABLE 3

|  | 0.5 ms | 1.0 ms | 2.0 ms |
| --- | --- | --- | --- |
| Archimedean | 67.5% | 77.2% | 81.5% |
| Fully sampled | 72.4% | 80.7% | 83.2% |
| Intercone compensation | 72.4% | 82.5% | 87.6% |
| Density compensation | 72.8% | 87.2% | 91.8% |

Figure 11:
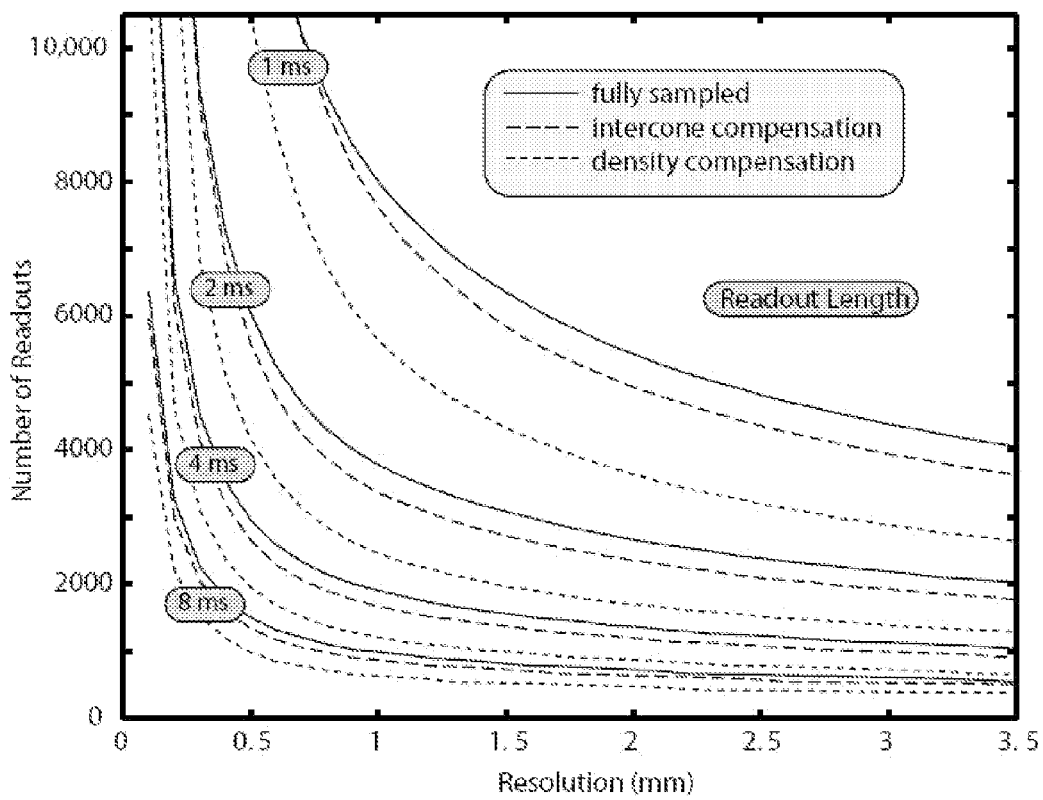
FIG. 11 graphs the number of readouts versus resolution for several readout lengths.

Another way to look at the tradeoffs is to hold the readout length and matrix size constant and vary the resolution. This yields the curves shown in FIG. 11. FIG. 11 graphs the number of readouts versus resolution for several readout lengths, FOV of 100 times the resolution, maximum gradient amplitude of 40 mT/m, and a maximum gradient slew rate of 150 T/m/s. These curves can be used by pulse sequence designers to select an appropriate readout time given a desired resolution and number of repetitions.

3.3.2 Point Spread Functions

Figure 12:
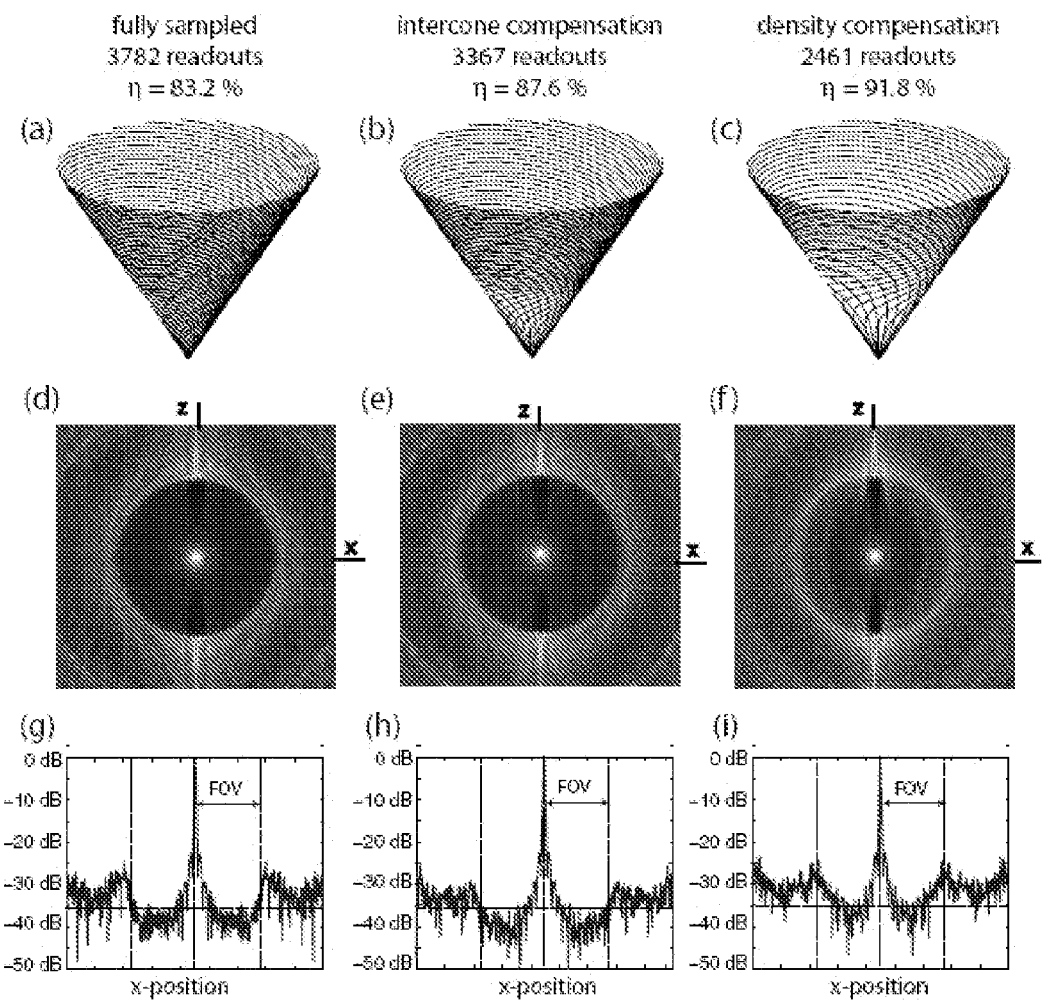
FIGS. 12a-i show representative depictions for fully sampled readouts, intercone compensation readouts, and density compensation readouts.

FIGS. 12a-c show representative depictions of a cone for fully sampled readouts FIG. 12a, intercone compensation readouts FIG. 12b, and density compensation readouts FIG. 12c. FIGS. 12d-f show the xz-plane of the point spread functions for fully sampled readouts FIG. 12d, intercone compensation readouts FIG. 12e, and density compensation readouts FIG. 12f. FIGS. 12g-i show plots showing the aliasing energy along the x-axis for fully sampled readouts FIG. 12g, intercone compensation readouts FIG. 12h, and density compensation readouts FIG. 12i. The point spread functions resulting from various sampling distribution strategies are shown in FIGS. 12a-i. As expected, the fully sampled and intercone compensated sampling strategies result in very high-quality point spread functions, while the density compensation strategy results in additional aliasing inside the desired FOV. Of particular interest is that the aliasing energy tends to bunch up along the z-axis, while it is highly diffuse in the xy-plane. Thus, it is better for objects to extend past the prescribed field of view in the xy-plane as opposed to the z-axis. This is convenient since slab select RF excitation pulses can be used to guarantee the extent of the imaged field of view in a single axis.

3.3.3 Increasing SNR Efficiency

Figure 13:
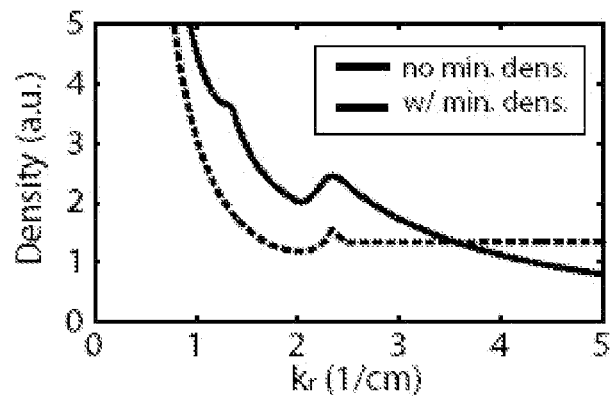
FIG. 13 illustrates the sampling densities for a trajectory along a particular cone.
Figure 14:
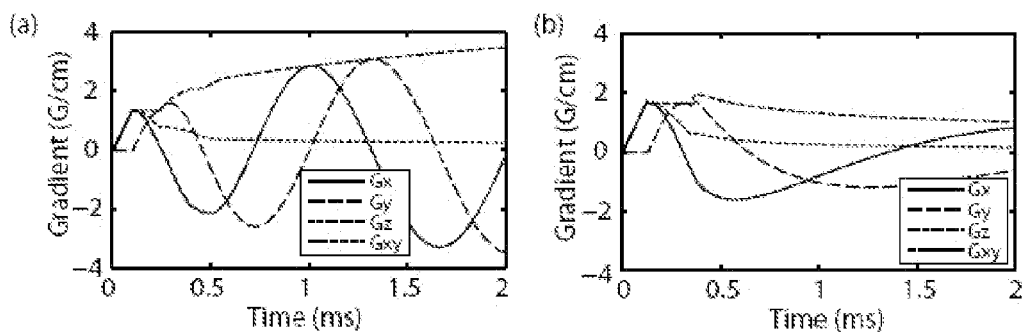
FIGS. 14a-b show gradient waveforms covering a particular cone.

By increasing the minimum density design parameter, $dens_{min}$, the SNR efficiency can be increased in exchange for increasing the number of readouts. FIG. 13 illustrates the sampling densities for a trajectory along a particular cone with a polar angle of 20 degrees, resolution of 1 mm, FOV of 10 cm, and intercone compensation with no minimum density and with a minimum density of 1.25 in arbitrary units. As can be seen in FIG. 13, if no minimum density is specified, the density tends to decrease as $k_r$ increases. However, if a minimum density is specified, then the density is forced to be uniform for at least some portion of the trajectory. The resulting gradient waveforms are shown in FIGS. 14a-b, which show gradient waveforms covering a particular cone with a polar angle of 20 degrees, resolution of 1 mm, FOV of 10 cm, and intercone compensation with no minimum density, FIG. 14a, and a minimum density of 1.25 in arbitrary units, FIG. 14b. Enforcing the minimum density causes the gradient amplitude to be reduced toward the end of the waveform, and as a result, the trajectory makes fewer turns, causing more readouts to be required.

Figure 15:
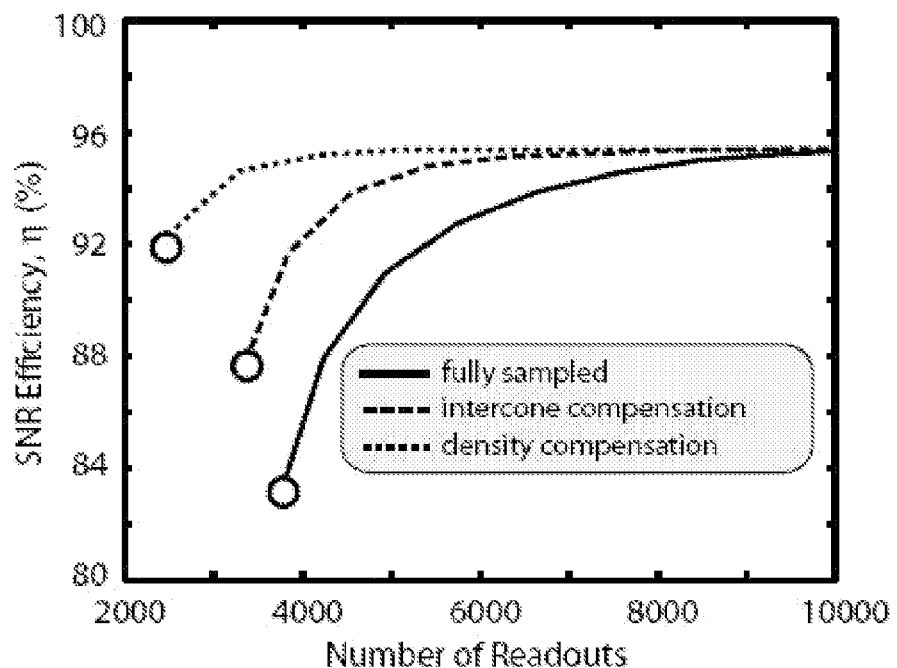
FIG. 15 plots SNR efficiency against number of readouts.

The resulting tradeoff is shown in FIG. 15, which plots SNR efficiency against number of readouts, enabled by varying the minimum density, for 3 D cones with a prescribed resolution of 1 mm and FOV of 10 cm and a readout length of 2 ms. Even small increases in the number of readouts can lead to substantial increases in the SNR efficiency. For the same number of readouts (3782), the intercone compensation scheme results in a 10% increase in SNR efficiency over the fully sampled scheme. Interestingly, once the number of readouts becomes large, the fully sampled cone has the same SNR efficiency as the ones with intercone compensation and density compensation. For applications that are highly SNR-limited and may not require fast scan times, it may be preferable to use fully sampled cones, which will not suffer at all from unwanted aliasing artifacts.

In the limit, as $dens_{min}$ is increased, the number of readouts increases, the trajectory twists less and less (it starts to look more like a radial line), and the gradient amplitude should be proportional to $1/k_r^2$, the intrinsic density of the corresponding trajectory. The desired gradient amplitude at the origin of k-space would need to be infinite, which is clearly impossible. Therefore, the maximum SNR efficiency is limited by the slew rate and/or maximum amplitude at the beginning of the waveform.

3.3.4 Anisotropic Fields of View

Figure 16:
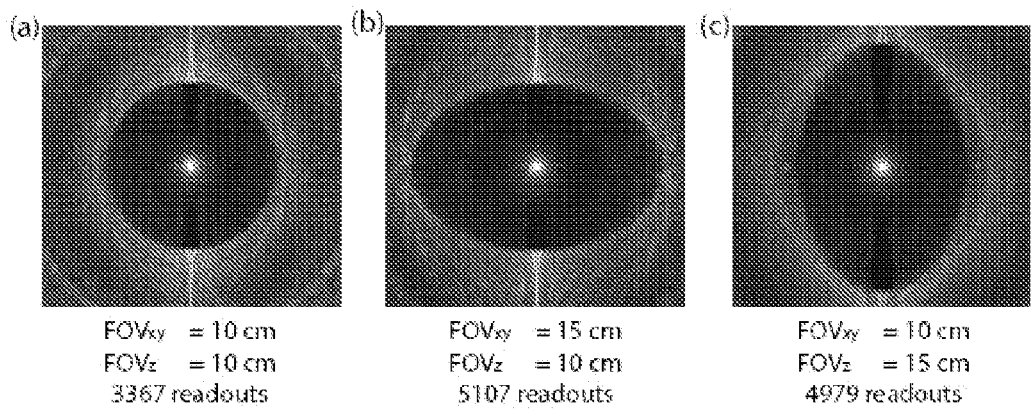
FIGS. 16a-c show high-quality point spread functions obtained with anisotropic fields of view.

With the trajectory design algorithm described in this chapter, it is possible to prescribe cones which support anisotropic fields of view and resolutions. High-quality point spread functions obtained with anisotropic fields of view for a spherical volume is shown in FIG. 16a, for a "flat" ellipsoidal volume is shown in FIG. 16b, and for a "tall" ellipsoidal volume is shown in FIG. 16c. These point spread functions are windowed identically to the ones in FIGS. 12d-f, and are also symmetric about the z-axis.

Figure 17:
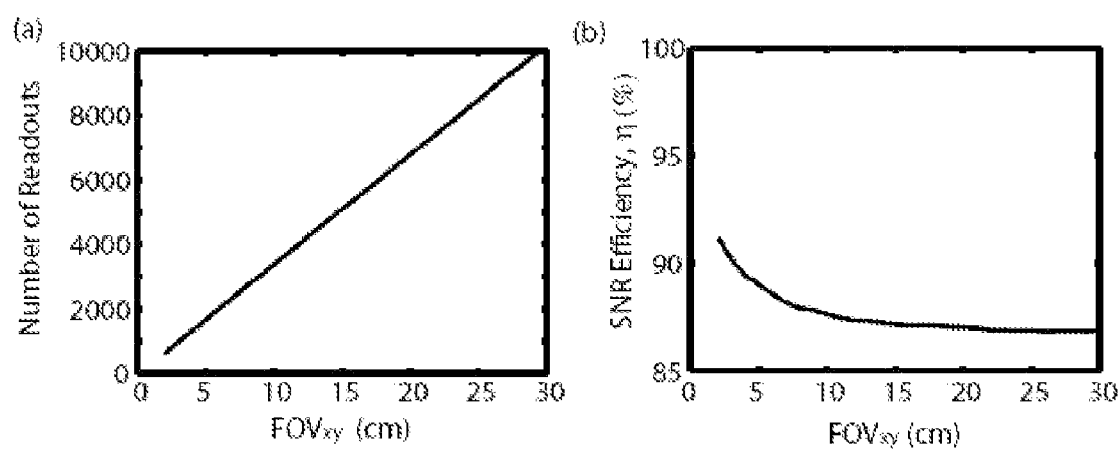
FIGS. 17a-b show tradeoffs between the number of readouts and SNR efficiency versus the anisotropy of the prescribed FOV.

Tradeoffs between the number of readouts versus the anisotropy of the prescribed FOV, shown in FIG. 17a, and SNR efficiency versus the anisotropy of the prescribed FOV, shown in FIG. 17b are demonstrated. The number of readouts scales nearly linearly with the axial field of view despite the fact that the volume of the overall field of view scales with the square of the axial field of view. That is, from a volume efficiency perspective, it is better to image "flat" fields of view (since four times the volume with only twice as many readouts can be imaged). However, from an SNR efficiency perspective, it is preferred to image "tall" fields of view, since there is a slight SNR boost (due to the fact that relatively less twisting in the xy-plane is required and so the trajectory can escape the center of k-space more quickly).

3.4 Summary

Thus, the sampling requirements for 3 D cones k-space trajectories has been described in detail and an algorithm capable of generating trajectories is developed that satisfy both the sampling constraints, hardware constraints, and density constraints. The algorithm is capable of generating non-isotropic fields of view and resolutions, reusing waveforms, and increasing SNR efficiency in exchange for requiring more readouts. Enabling these highly flexible and favorable tradeoffs while maintaining the desirable properties of radial trajectories makes the 3 D cones k space trajectory very appealing for many applications, such as whole-heart coronary angiography or imaging of tendons and ligaments.

3.5 General Implementation

Figure 18:
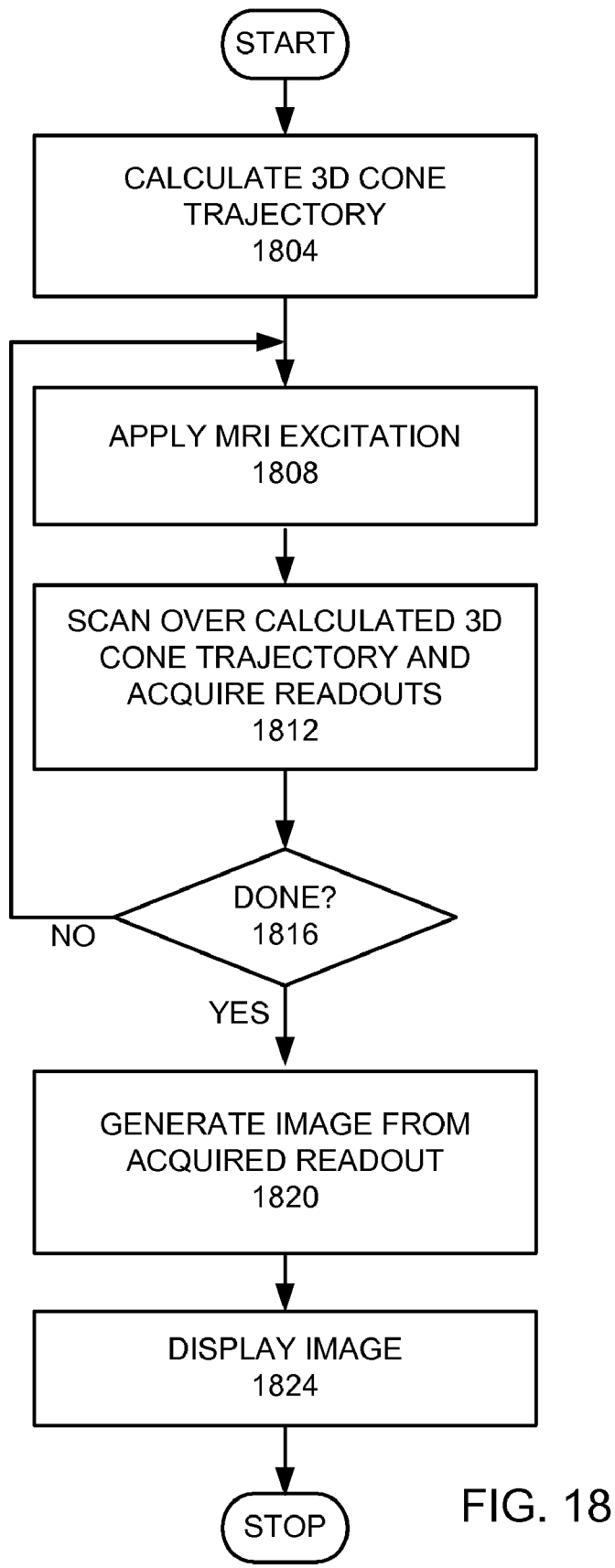
FIG. 18 is a flow chart of an embodiment of the invention.
Figure 19:
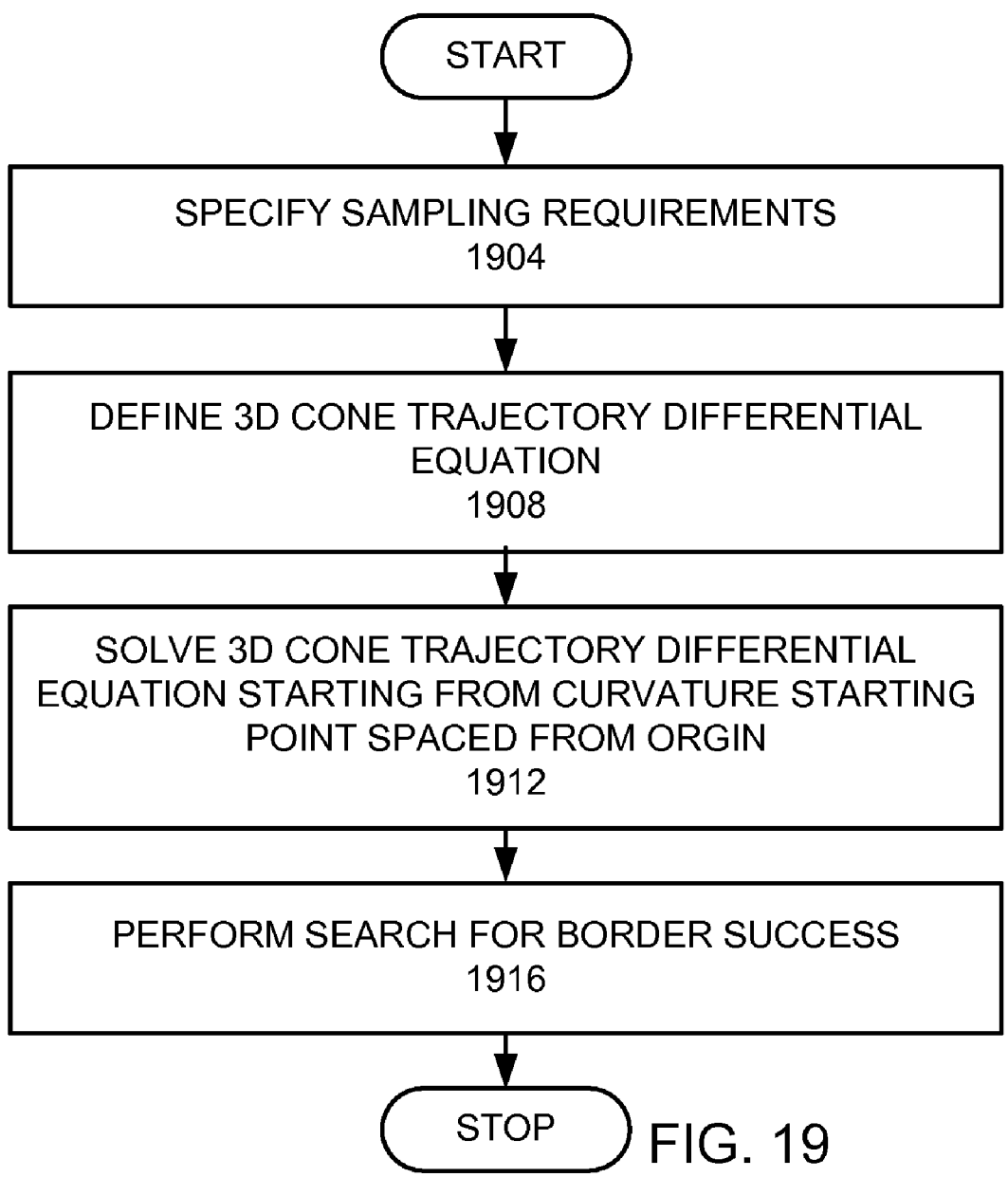
FIG. 19 is a more detailed flow chart of a step of calculating the 3 D cone trajectory.

FIG. 18 is a flow chart of an embodiment of the invention. A 3 D cone trajectory is calculated (step 1804). FIG. 19 is a more detailed flow chart of the step of calculating the 3 D cone trajectory (step 1804). Sampling requirements are specified (step 1904). The sampling requirements may be specified by an end user. Such sampling requirements comprise field of view, resolution, number of interleaves, intercone spacing compensation factor values, and density compensation. More preferably, the sampling requirements further comprise readout length. The sampling requirements are used to define a 3 D cone trajectory differential equation (step 1908). The 3 D cone trajectory differential equation is solved starting from a curvature starting point spaced from the origin (step 1912). A search for border successes is then performed (step 1916).

Figure 20:
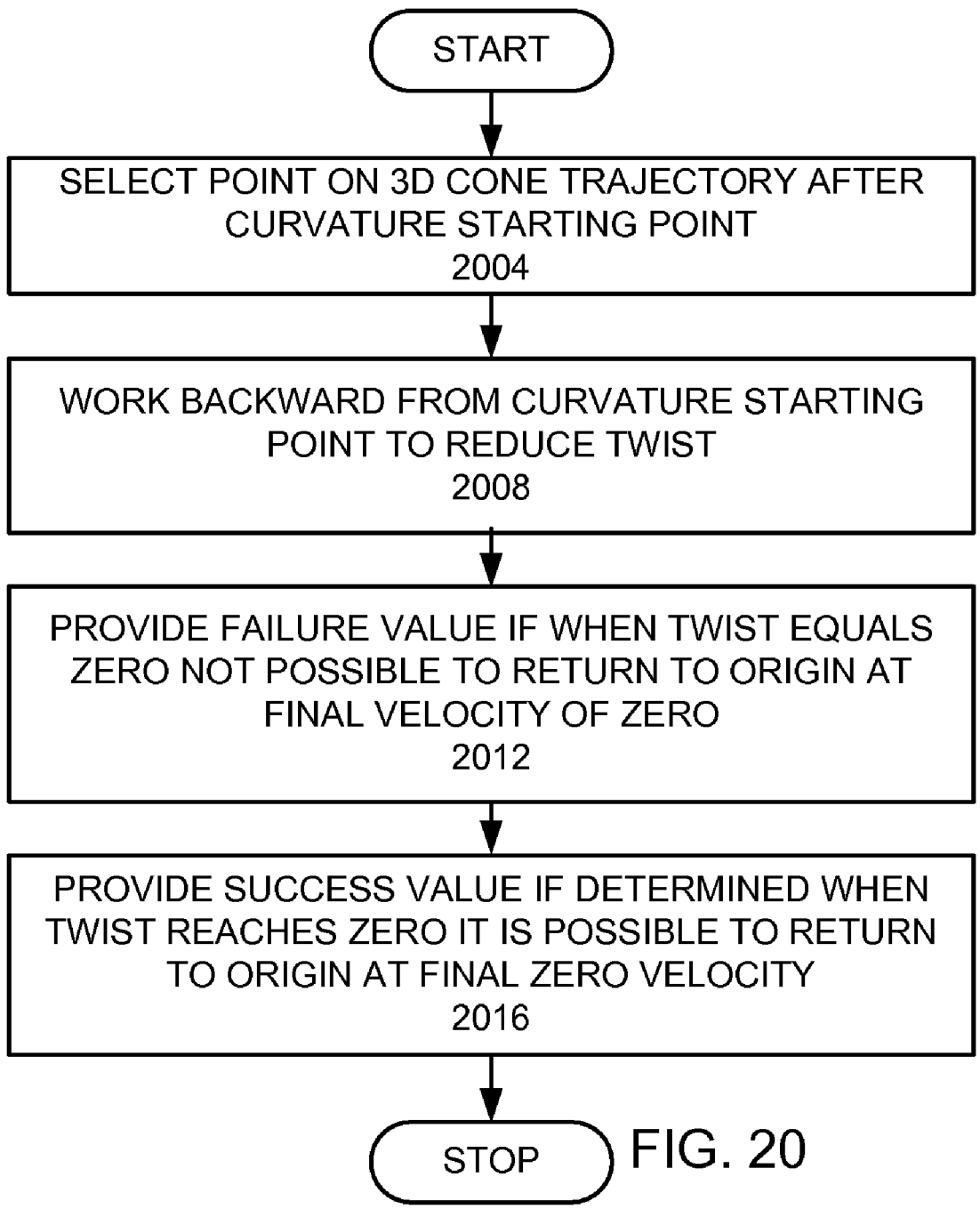
FIG. 20 is a more detailed flow chart of the search for border successes.

FIG. 20 is a more detailed flow chart of the search for border successes (step 1916). A point is selected on the 3 D cone trajectory after the curvature starting point (step 2004). The process works backward from the curvature starting point to reduce twist (step 2008). A failure value is provided if when the twist equals zero, it is not possible to return to the origin at a final velocity of zero (step 2012). A success value is provided if when the twist reaches zero, it is possible to return to the origin at a final zero velocity (step 2016). The border success which is being searched for is defined as the point on the generated trajectory where all earlier points result in success values and all later points result in failure values.

An MRI excitation is applied (step 1808). A scan is performed over the calculated 3 D cone trajectory and readouts are acquired (step 1812) These two steps are sequentially repeated a plurality of times until a desired volume scan is completed (step 1816) so that an MRI excitation is performed for each trajectory. An image is generated from the acquired readout (step 1820). The image is displayed (step 1824).

Figure 21:
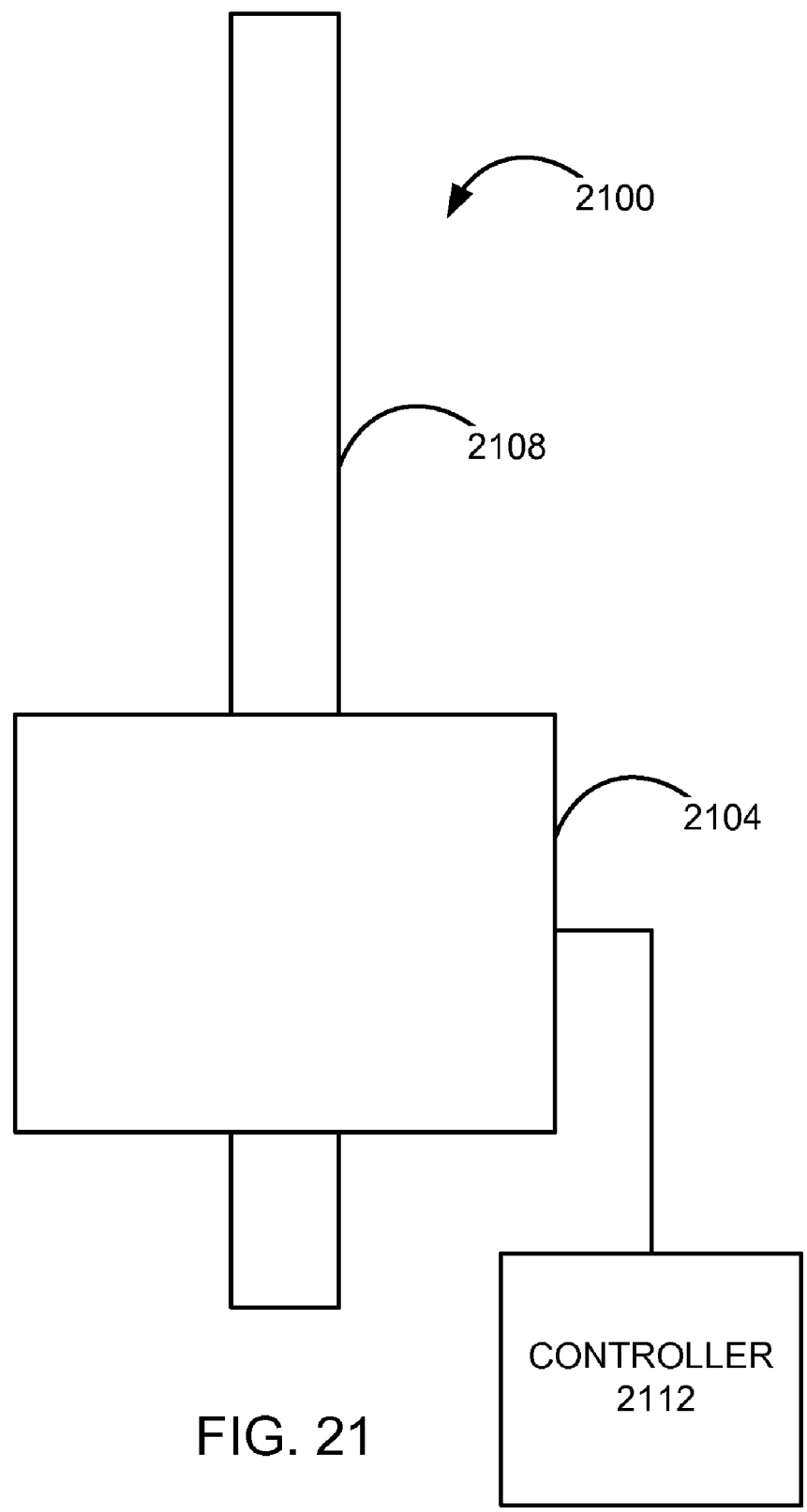
FIG. 21 is a schematic top view of a magnetic resonance imaging (MRI) system that may be used in an embodiment of the invention.

FIG. 21 is a schematic top view of a magnetic resonance imaging (MRI) system 2100 that may be used in an embodiment of the invention. The MRI system 2100 comprises a magnet system 2104, a patient transport table 2108 connected to the magnet system, and a controller 2112 controllably connected to the magnet system. In one example, a patient would lie on the patient transport table 2108 and the magnet system 2104 would pass around the patient. The controller 2112 would control magnetic fields and radio frequency (RF)

signals provided by the magnet system 2104 and would receive signals from detectors in the magnet system 2104.

Figure 22A:
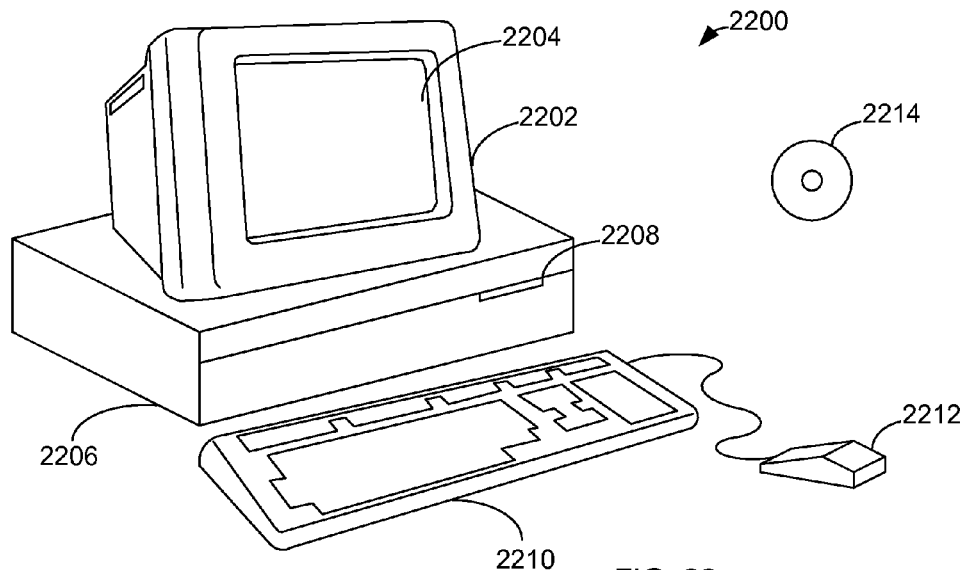
FIGS. 22a-b illustrate a computer system that may be used in an embodiment of the invention.
Figure 22B:
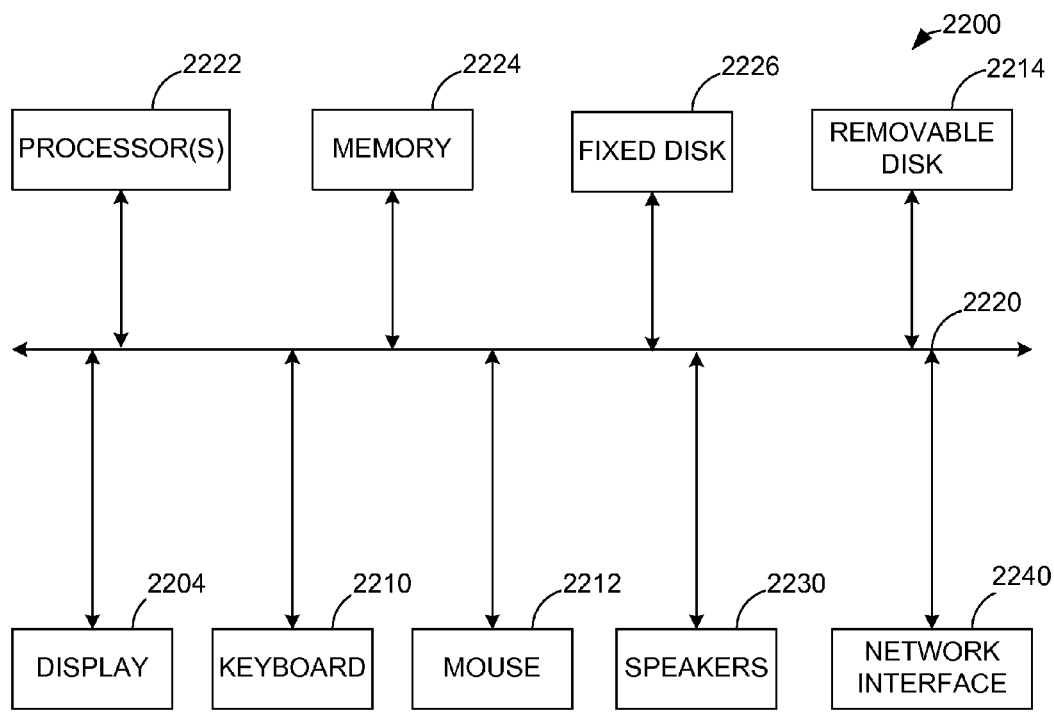

FIGS. 22*a* and 22*b* illustrate a computer system 2200, which is suitable for implementing a controller 2112 used in embodiments of the present invention. FIG. 22*a* shows one possible physical form of the computer system. Of course, the computer system may have many physical forms ranging from an integrated circuit, a printed circuit board, and a small handheld device up to a huge super computer. Computer system 2200 includes a monitor 2202, a display 2204, a housing 2206, a disk drive 2208, a keyboard 2210, and a mouse 2212. Disk 2214 is a computer-readable medium used to transfer data to and from computer system 2200.

FIG. 22*b* is an example of a block diagram for computer system 2200. Attached to system bus 2220 are a wide variety of subsystems. Processor(s) 2222 (also referred to as central processing units, or CPUs) are coupled to storage devices, including memory 2224. Memory 2224 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 2226 is also coupled bi-directionally to CPU 2222; it provides additional data storage capacity and may also include any of the computer-readable media described below. Fixed disk 2226 may be used to store programs, data, and the like and is typically a secondary storage medium (such as a hard disk) that is slower than primary storage. It will be appreciated that the information retained within fixed disk 2226 may, in appropriate cases, be incorporated in standard fashion as virtual memory in memory 2224. Removable disk 2214 may take the form of the computer-readable media described below.

CPU 2222 is also coupled to a variety of input/output devices, such as display 2204, keyboard 2210, mouse 2212, and speakers 2230. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 2222 optionally may be coupled to another computer or telecommunications network using network interface 2240. With such a network interface, it is contemplated that the CPU might receive information from the network, or might output information to the network in the course of performing the above-described method steps. Furthermore, method embodiments of the present invention may execute solely upon CPU 2222 or may execute over a network such as the Internet in conjunction with a remote CPU that shares a portion of the processing.

In addition, embodiments of the present invention further relate to computer storage products with a computer-readable medium that has computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

APPENDIX A

Solving the 3 D Cones Differential Equation

In order to solve the differential equations resulting from Equations 3.12 and 3.13, all the gradient amplitude, slew rate, and sampling density constraints must be expressed as functions of $k_r(t)$ and its derivatives. The shortest possible k-space trajectory can be found by maximizing the derivatives of $k_r(t)$ at each time point subject to those constraints.

A.1 Applying Constraints

The actual differential equation to be solved is the one that maximizes $dk_r(t)/dt$ at every time point subject to the constraints. Therefore, all the constraints must be converted into limitations on $dk_r(t)/dt$ or $d^2k_r(t)/dt^2$.

A.1.1 Gradient Amplitude Constraints

Differentiating Equations 3.12 and 3.13 with respect to time and dividing by the gyromagnetic ratio gives the gradient waveforms, $$g_{xy}(t) = \left(\frac{\gamma}{2\pi}\right)^{-1} \left[\frac{dk_r(t)}{dt}\left(1 + ik_r(t)\frac{d\phi(k_r(t))}{dk_r}\right)\right] e^{i\phi(k_r(t))} \sin(\theta_n) \quad \text{(A.1)}$$

$$g_z(t) = \left(\frac{\gamma}{2\pi}\right)^{-1} \frac{dk_r(t)}{dt} \cos(\theta_n) \quad \text{(A.2)}$$

to which the gradient amplitude constraints apply.

The gradient amplitude constraint in the xy-plane is $$|g_{xy}(t)| \leq G_{max,xy} \quad \text{(A.3)}$$

which results in the limitation $$\left(\frac{dk_r(t)}{dt}\right)_{max,xy} = \frac{G_{max,xy}\left(\frac{\gamma}{2\pi}\right)}{\sqrt{1 + \left(k_r(t)\frac{d\phi(k_r(t))}{dk_r}\right)^2 \sin(\theta_n)}} \quad \text{(A.4)}$$

The gradient amplitude constraint in the z-axis is $$|g_z(t)| \leq G_{max,z} \quad \text{(A.5)}$$

which results in the limitation $$\left(\frac{dk_r(t)}{dt}\right)_{max,z} = \frac{G_{max,z}\left(\frac{\gamma}{2\pi}\right)}{\cos(\theta_n)} \quad \text{(A.6)}$$

The overall gradient amplitude should be limited in order to enforce a particular desired minimum sampling density, $dens_{min}(k_r)$.

Solving Equation 3.28 for $dk_r(t)/dt$ gives $$\left(\frac{dk_r(t)}{dt}\right)_{max,dens} = \frac{N_{int}(\theta_n)FOV_\theta(\theta_n + \pi/2)k_{max}(\theta_n)}{dens_{min}(k_r(t))T_s 2\pi\sin(\theta_n)k_r(t)^2} \quad (A.7)$$

Combining the constraints given by Equations A.4, A.6 and A.7 gives a maximum value of $dk_r(t)/dt$ of $$\left(\frac{dk_r(t)}{dt}\right)_{max} = \min\left(\left(\frac{dk_r(t)}{dt}\right)_{max,xy}, \left(\frac{dk_r(t)}{dt}\right)_{max,z}, \left(\frac{dk_r(t)}{dt}\right)_{max,dens}\right) \quad (A.8)$$

A.1.2 Gradient Slew Rate Constraints

Differentiating Equations A.1 and A.2 with respect to time gives the slew rates of the gradient waveforms, $$s_{xy}(t) = \left(\frac{\gamma}{2\pi}\right)^{-1}\left[\left(\frac{d^2k_r(t)}{dt^2} - k_r(t)\left(\frac{dk_r(t)}{dt}\frac{d\phi(k_r(t))}{dk_r}\right)^2\right) + i\left(2\frac{d\phi(k_r(t))}{dk_r} + k_r(t)\frac{d^2\phi(k_r(t))}{dk_r^2}\right)\left(\frac{dk_r(t)}{dt}\right)^2 + i\left(k_r(t)\frac{d\phi(k_r(t))}{dk_r}\frac{d^2k_r(t)}{dt^2}\right)\right]e^{i\phi(k_r(t))}\sin(\theta_n) \quad (A.9)$$

$$s_z(t) = \left(\frac{\gamma}{2\pi}\right)^{-1}\frac{d^2k_r(t)}{dt^2}\cos(\theta_n) \quad (A.10)$$

to which the slew rate constraints apply.

To apply the slew rate constraint in the xy-plane, $$|s_{xy}(t)| \leq S_{max,xy} \quad (A.11)$$

this embodiment solves $$(s_{xy}(t))^2 \leq S_{max,xy}^2 \quad (A.12)$$

for $d^2k_r(t)/dt^2$.

After substituting Equation A.9 into the above formula and expanding, it can be seen it has the form $$\left(A + \frac{d^2k_r(t)}{dt^2}\right)^2 + \left(C + D\frac{d^2k_r(t)}{dt^2}\right)^2 \leq E^2 \quad (A.13)$$

with $$A = -\left(\frac{dk_r(t)}{dt}\right)^2\left(\frac{d\phi(k_r(t))}{dk_r}\right)^2 k_r(t) \quad (A.14)$$

$$C = \left(\frac{dk_r(t)}{dt}\right)^2\left(2\frac{d\phi(k_r(t))}{dk_r} + k_r(t)\frac{d^2\phi(k_r(t))}{dk_r^2}\right)$$

$$D = k_r(t)\frac{d\phi(k_r(t))}{dk_r}$$

$$E = \frac{S_{max,xy}^2}{\sin^2(\theta_n)}\frac{\gamma}{2\pi}$$

The left hand side is simply a parabola in $(d^2k_r(t)/dt^2)^2$ with a positive high-order term. Taking the larger solution of the corresponding quadratic equation (formed by enforcing equality) will result in the maximum allowed value of $d^2k_r(t)/dt^2$ based on the slew-rate constraint in the xy-plane, $$\left(\frac{d^2k_r(t)}{dt^2}\right)_{max,xy} = -\frac{A + CD + \sqrt{2ACD + E^2 - C^2 - D^2A^2 + D^2E^2}}{1 + D^2} \quad (A.15)$$

The maximum allowed value of $d^2k_r(t)/dt^2$ based on the slew rate constraint in the z-axis is found by combining Equation A.10 and the constraint $$|s_z(t)| \leq S_{max,z} \quad (A.16)$$

giving $$\left(\frac{d^2k_r(t)}{dt^2}\right)_{max,z} = \frac{S_{max,z}^2}{\cos(\theta_n)}\left(\frac{\gamma}{2\pi}\right) \quad (A.17)$$

Combining Equations A.15 and A.17 gives the maximum allowed value of $d^2k_r(t)/dt^2$ based on slew rate constraints, $$\left(\frac{d^2k_r(t)}{dt^2}\right)_{max} = \min\left(\left(\frac{d^2k_r(t)}{dt^2}\right)_{max,xy}, \left(\frac{d^2k_r(t)}{dt^2}\right)_{max,z}\right) \quad (A.18)$$

A.2 Solving the Differential Equation

This provides a second-order differential equation which can be attempted to solve numerically.

This equation has the form $$\left(\frac{d^2k_r(t)}{dt^2}\right) = f\left(k_r(t), \frac{dk_r(t)}{dt}, \frac{d\phi(k_r(t))}{dk_r}, \frac{d^2\phi(k_r(t))}{dk_r^2}\right) \quad (A.19)$$

where the function f determines the maximum value of $d^2k_r(t)/dt^2$ allowed by the constraints given in Equations A.18. The constraints on $dk_r(t)/dt$ can also be included at each step.

When solving differential equations numerically, it is important to ensure that all the derivatives are well-defined. Differentiating Equation 3.14 gives $$\frac{d^2\phi(k_r)}{dk_r^2} = \frac{-c_1 k_r^3 \frac{d\sigma(k_r)}{dk_r} + c_2\sigma(k_r)^3}{\sigma(k_r)^3 k_r^2 \sin(\theta_n)\sqrt{\frac{c_1 k_r^2 - c_2\sigma(k_r)^2}{\sigma(k_r)^2}}} \quad (A.20)$$

Clearly, when $c_1 k_r^2 - c_2\sigma(k_r)^2 = 0$, this function is undefined. One way to handle this is to start solving the differential equation at $k_{start}$, the point immediately after where this breakdown occurs. By examination of Equation 3.9, it can be seen that $k_{start}$ is also the point where the trajectory is required to start twisting. Equation A.20 is also undefined when $d\sigma(k_r)/dk_r$ is undefined. When choosing an appropriate $\sigma(k_r)$ function, it must be ensured that its derivative is defined for $k_r > k_{start}$ (removing any discontinuities using connecting splines if necessary).

Equation A.19 is broken into a set of 1st-order differential equations and uses the 4th-order Runge-Kutta method, shown in Algorithm 1. For initial values, first and second derivatives of $k_r(t)$ are chosen to be set to 0. This guarantees a valid waveform, but may result in a somewhat slower start than would otherwise be possible. However, a transition waveform will be selected later to connect the origin to this waveform. That transition waveform will ensure time-optimality so that the optimality of the beginning of the waveform does not need to be considered. This 4th-order Runge-Kutta method for solving sets of differential equations is robust, straightforward to implement and should work well even for large sampling times, $T_s$ (which can reduce computation time).

Now that a function for $k_r(t)$ and its derivative is obtained, numerical integration can be used to solve Equation 3.15 for $\phi(k_r(t))$. These functions can be used in Equations 3.12 and 3.13 to generate the 3D cones k-space trajectory from a radial distance of $k_{start}$ to $k_{max}$. The associated gradient waveform can be found through numerical differentiation of the k-space trajectory.

Algorithm 1—4th-Order Runge-Kutta Algorithm Applied to Equation A.19.

$$k_r(0) = k_{start}$$

$$\frac{dk_r(0)}{dt} = 0$$

$$\frac{d^2 k_r(0)}{dt} = 0$$

$$n = 0$$

while $(k_r(jT_s) < k_{max})$ $$q_1 = T_s \frac{dk_r(jT_s)}{dt}$$

$$r_1 = T_s f\left(k_r(jT_s), \frac{dk_r(jT_s)}{dt}, \frac{d\phi(k_r(jT_s))}{dk_r}, \frac{d^2\phi(k_r(jT_s))}{dk_r^2}\right)$$

$$q_2 = T_s\left(\frac{dk_r(jT_s)}{dt} + \frac{r_1}{2}\right)$$

$$r_2 = T_s f\left(k_r(jT_s) + \frac{q_1}{2}, \frac{dk_r(jT_s)}{dt} + \frac{r_1}{2}, \frac{d\phi\left(k_r(jT_s) + \frac{q_1}{2}\right)}{dk_r}, \frac{d^2\phi\left(k_r(jT_s) + \frac{q_1}{2}\right)}{dk_r^2}\right)$$

$$q_3 = T_s\left(\frac{dk_r(jT_s)}{dt} + \frac{r_2}{2}\right)$$

$$r_3 = T_s f\left(k_r(jT_s) + \frac{q_2}{2}, \frac{dk_r(jT_s)}{dt} + \frac{r_2}{2}, \frac{d\phi\left(k_r(jT_s) + \frac{q_2}{2}\right)}{dk_r}, \frac{d^2\phi\left(k_r(jT_s) + \frac{q_2}{2}\right)}{k_r^2}\right)$$

$$q_4 = T_s\left(\frac{dk_r(jT_s)}{dt} + r_3\right)$$

$$r_4 = T_s f\left(k_r(jT_s) + q_3, \frac{dk_r(jT_s)}{dt} + r_3, \frac{d\phi(k_r(jT_s) + q_3)}{dk_r}, \frac{d^2\phi(k_r(jT_s) + q_3)}{dk_r^2}\right)$$

$$qq = \frac{1}{6}(q_1 + 2q_2 + 2q_3 + q_4)$$

$$rr = \frac{1}{6}(r + 2r_2 + 2r_3 + r_4)$$

$$k_r((j+1)T_s) = k_r(jT_s) + \min\left(qq, \left(\frac{dk_r(t)}{dt}\right)_{max}\right)$$

$$dk_r((j+1)T_s) = \min\left(dk_r(jT_s) + rr, \left(\frac{dk_r(t)}{dt}\right)_{max}\right)$$

$$j = j + 1$$

endwhile

While this invention has been described in terms of several preferred embodiments, there are alterations, permutations, modifications and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. A method of performing a three dimensional magnetic resonance imaging (MRI), comprising:
    using sampling requirements to define a three dimensional cone trajectory differential equation;
    solving the three dimensional cone differential equation to obtain a three dimensional cone trajectory starting from a curvature starting point spaced apart from an origin;
    performing a search for a border success by performing a plurality of cycles, comprising:
        selecting a point on the three dimensional cone trajectory after the curvature starting point;
        working backward from the curvature starting point to reduce twist;
        providing a failure value if it is determined that when the twist reaches zero it is not possible to return to the origin at a final velocity of zero while meeting system constraints; and
        providing a success value if it is determined that when the twist reaches zero it is possible to return to the origin at a final velocity of zero while meeting system constraints;
    performing a plurality of cycles, wherein each cycle comprises:
        applying a magnetic resonance image excitation; and
        scanning along the calculated three dimensional cone trajectory and acquiring a readout;
        producing a three dimensional image from the readout of the plurality of cycles.

2. The method, as recited in claim 1, wherein the sampling requirements comprise field of view, resolution, number of interleaves, intercone spacing compensation factor values, and density compensation.

3. The method, as recited in claim 2, wherein the sampling requirements further comprise readout length.

4. The method, as recited in claim 3, wherein a plurality of three dimensional cone trajectories are calculated for a set of polar angles and azimuthal angles, each trajectory is scanned, a readout is acquired for each trajectory, and a three dimensional image is produced from the collection of readouts.

5. The method, as recited in claim 4, wherein the performing the search uses a binary search.

6. The method, as recited in claim 5, wherein the reducing twist means selecting new velocities that point closer to the origin than previous velocities while complying with the three dimensional cone sampling requirements and system constraints.

7. The method, as recited in claim 6, wherein the system constraints comprise the system maximum slew rate, and the maximum gradient amplitude.

8. The method, as recited in claim 7, wherein different fields of view and resolutions can be specified independently for the different orthogonal dimensions.

9. The method, as recited in claim 1, wherein different fields of view and resolutions can be specified independently for the different orthogonal dimensions.

10. The method, as recited in claim 1, wherein the performing the search uses a binary search.

11. The method, as recited in claim 1, wherein the reducing twist means selecting new velocities that point closer to the origin than previous velocities while complying with the three dimensional cone sampling requirements and system constraints.

12. The method, as recited in claim 2, further comprising receiving specified sampling requirements.

13. A method of calculating the three dimensional cone trajectory, comprising:
    performing a search for the three dimensional cone trajectory with a specified time duration by performing a plurality of cycles, comprising:
        performing a search for a border success by performing a plurality of cycles, comprising:
            selecting a point on the three dimensional cone trajectory after the curvature starting point;
            working backward from the curvature starting point to reduce twist;
            providing a failure value if it is determined that when the twist reaches zero it is not possible to return to the origin at a final velocity of zero while meeting system constraints; and
            providing a success value if it is determined that when the twist reaches zero it is possible to return to the origin at a final velocity of zero while meeting system constraints; and
        stopping when the generated three dimensional cone trajectory has reached the specified time duration.

14. The method, as recited in claim 13, wherein the performing the search uses a binary search.

15. The method, as recited in claim 14, wherein the reducing twist means selecting new velocities that point closer to the origin than previous velocities while complying with the three dimensional cone sampling requirements and system constraints.

16. The method, as recited in claim 15, wherein the system constraints comprise the system maximum slew rate, and the maximum gradient amplitude.

17. A magnetic resonance imaging apparatus, comprising:
    a magnetic resonance imaging excitation and detection system; and
    a controller electrically connected to the magnetic resonance imaging excitation and detection system, comprising:
        a display;
        at least one processor; and
        computer readable media, comprising:
            a) computer readable coded for using sampling requirements to define a three dimensional cone trajectory differential equation;
            b) computer readable code for solving the three dimensional cone differential equation to obtain a three dimensional cone trajectory starting from a curvature starting point spaced apart from an origin;
            c) computer readable code for performing a search for a border success by performing a plurality of cycles, comprising:
                computer readable code for selecting a point on the three dimensional cone trajectory after the curvature starting point;
                computer readable code for working backward from the curvature starting point to reduce twist;
                computer readable code for providing a failure value if it is determined that when the twist reaches zero it is not possible to return to the origin at a final velocity of zero while meeting system constraints; and
                computer readable code for providing a success value if it is determined that when the twist reaches zero it is possible to return to the origin at a final velocity of zero while meeting system constraints;
            d) computer readable code performing for a plurality of cycles, wherein each cycle comprises:
                applying a magnetic resonance imaging excitation; and
                scanning along the calculated three dimensional cone trajectory and acquiring a readout;
            e) computer readable code for producing a three dimensional image from the readout of the plurality of cycles; and
            f) computer readable code for displaying the three dimensional image on the display.

18. The method, as recited in claim 17, wherein the sampling requirements comprise field of view, resolution, number of interleaves, intercone spacing compensation factor values, and density compensation.

* * * * *

UNITED STATES PATENT AND TRADEMARK OFFICE
CERTIFICATE OF CORRECTION

| | | |
|---|---|---|
| PATENT NO. | : 7,548,062 B1 | Page 1 of 1 |
| APPLICATION NO. | : 12/055584 | |
| DATED | : June 16, 2009 | |
| INVENTOR(S) | : Gurney | |

It is certified that error appears in the above-identified patent and that said Letters Patent is hereby corrected as shown below:

In the Specification Under Column 1:

Please replace Column 1, Line No. 6-8 with

--This invention was made with Government support under contract HL039297 awarded by the National Institutes of Health. The Government has certain rights in the invention.--

Signed and Sealed this
Twenty-sixth Day of April, 2016

Michelle K. Lee
*Director of the United States Patent and Trademark Office*